United States Patent
Sakurada et al.

(10) Patent No.: US 9,934,847 B2
(45) Date of Patent: Apr. 3, 2018

(54) MEMORY SYSTEM STORING 4-BIT DATA IN EACH MEMORY CELL AND METHOD OF CONTROLLING THEREOF INCLUDING SOFT BIT INFORMATION

(71) Applicant: Toshiba Memory Corporation, Minato-ku (JP)

(72) Inventors: Kenji Sakurada, Yamato (JP); Masanobu Shirakawa, Chigasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/238,087

(22) Filed: Aug. 16, 2016

(65) Prior Publication Data
US 2017/0263312 A1    Sep. 14, 2017

Related U.S. Application Data

(60) Provisional application No. 62/306,884, filed on Mar. 11, 2016.

(51) Int. Cl.
G11C 11/56     (2006.01)
G11C 16/08     (2006.01)
G11C 29/42     (2006.01)

(52) U.S. Cl.
CPC ...... *G11C 11/5642* (2013.01); *G11C 11/5628* (2013.01); *G11C 16/08* (2013.01); *G11C 29/42* (2013.01)

(58) Field of Classification Search
None
See application file for complete search history.

(56) References Cited

U.S. PATENT DOCUMENTS

| | | | |
|---|---|---|---|
| 7,852,675 B2 | 12/2010 | Maejima | |
| 8,149,623 B2 | 4/2012 | Uchikawa et al. | |
| 8,385,117 B2 | 2/2013 | Sakurada et al. | |
| 8,952,426 B2 | 2/2015 | Maejima | |
| 9,472,298 B1* | 10/2016 | Louie | G11C 16/28 |
| 2008/0062758 A1* | 3/2008 | Honma | G11C 11/5642 365/184 |
| 2009/0106485 A1* | 4/2009 | Anholt | G11C 11/5642 711/103 |
| 2010/0207195 A1 | 8/2010 | Fukuzumi et al. | |
| 2010/0223538 A1 | 9/2010 | Sakurada | |
| 2011/0194347 A1* | 8/2011 | Chae | G11C 11/5628 365/185.03 |
| 2011/0197015 A1* | 8/2011 | Chae | G11C 11/5642 711/103 |

(Continued)

FOREIGN PATENT DOCUMENTS

| | | |
|---|---|---|
| JP | 2010-205328 | 9/2010 |
| JP | 2011-40137 | 2/2011 |
| JP | 2012-181761 | 9/2012 |

*Primary Examiner* — J. H. Hur
(74) *Attorney, Agent, or Firm* — Oblon, McClelland, Maier & Neustadt, L.L.P.

(57) ABSTRACT

According to one embodiment, a memory system acquires HB information and SB1 information through SB4 information on each of four pages including LOWER, MIDDLE, UPPER, and HIGHER pages from a NAND memory 100 that includes QLCs each being capable of retaining a 4-bit value. An ECC circuit 260 of a memory controller 200 decodes the acquired HB information and SB1 to SB4 information on the four pages.

11 Claims, 29 Drawing Sheets

(56) References Cited

U.S. PATENT DOCUMENTS

| | | | |
|---|---|---|---|
| 2011/0280070 A1* | 11/2011 | Kim | G11C 16/26 |
| | | | 365/185.03 |
| 2011/0280084 A1* | 11/2011 | Radke | G11C 11/26 |
| | | | 365/185.21 |
| 2011/0284946 A1 | 11/2011 | Kiyotoshi | |
| 2012/0051144 A1* | 3/2012 | Weingarten | G11C 16/26 |
| | | | 365/185.24 |
| 2014/0281771 A1* | 9/2014 | Yoon | G06F 11/1068 |
| | | | 714/721 |
| 2014/0365836 A1* | 12/2014 | Jeon | G11C 16/26 |
| | | | 714/721 |
| 2015/0049547 A1* | 2/2015 | Kim | G11C 29/028 |
| | | | 365/185.09 |
| 2017/0046220 A1* | 2/2017 | Sharon | G06F 3/0619 |

\* cited by examiner

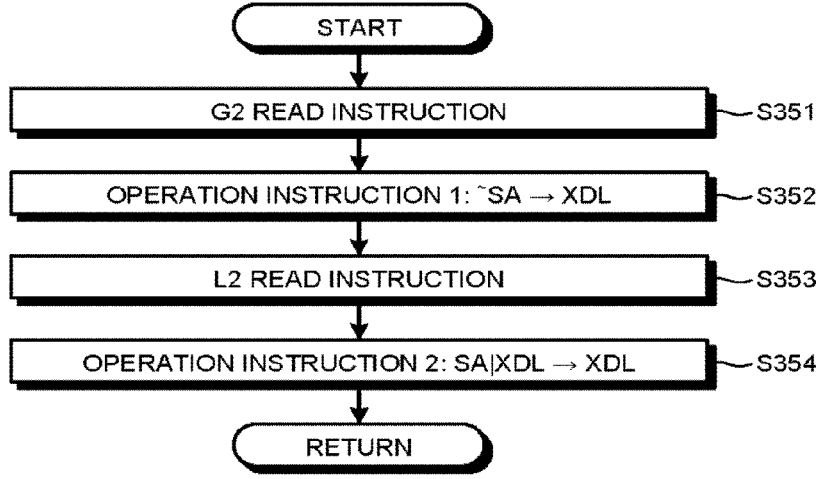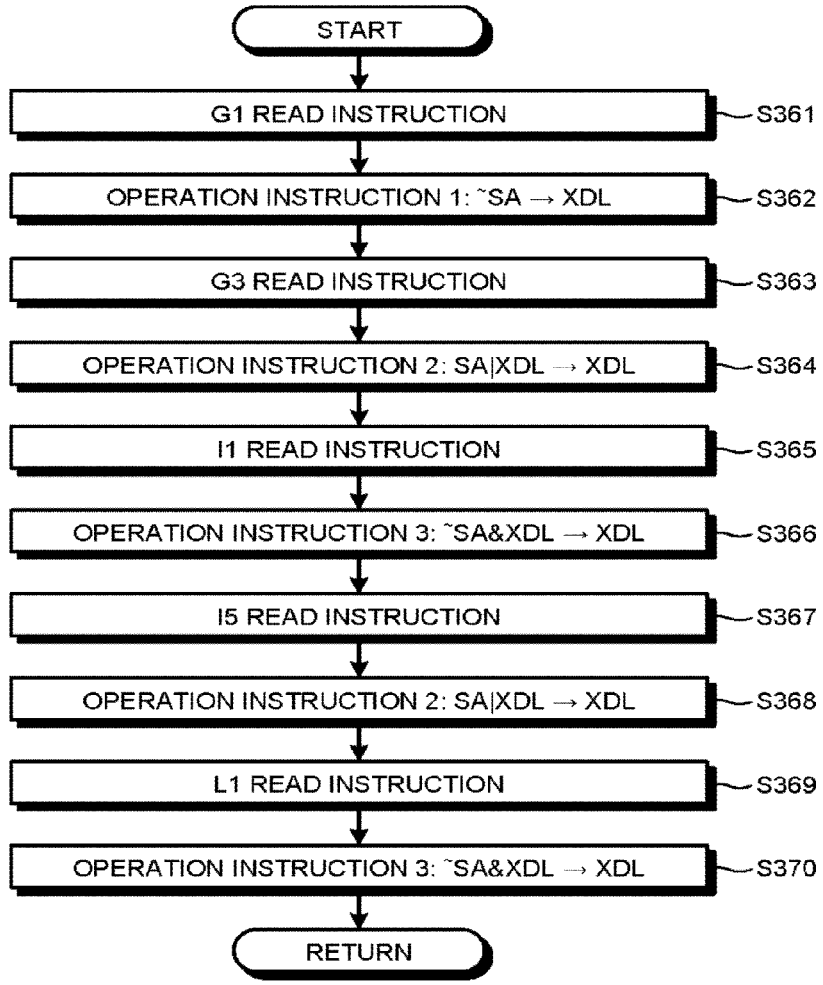

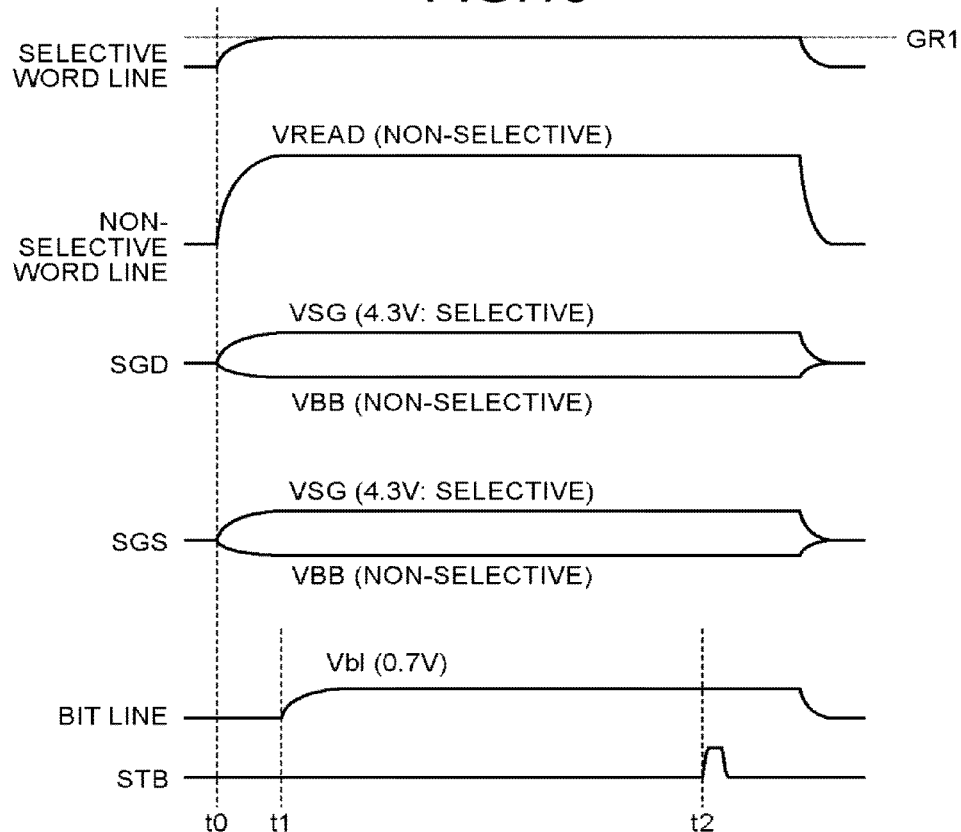
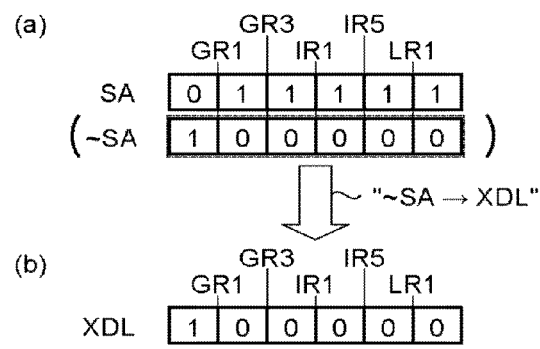

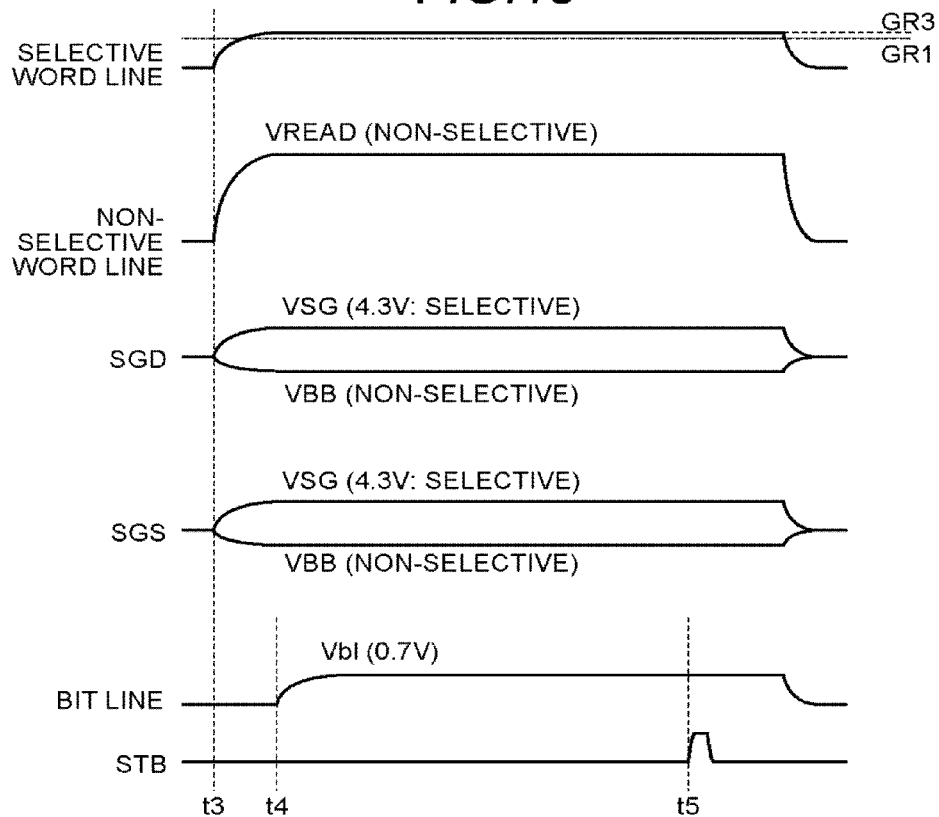
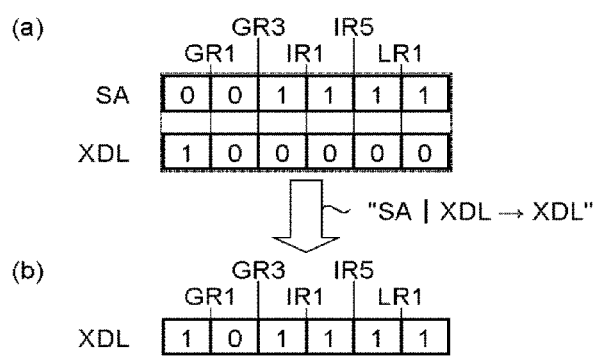

MEMORY SYSTEM STORING 4-BIT DATA IN EACH MEMORY CELL AND METHOD OF CONTROLLING THEREOF INCLUDING SOFT BIT INFORMATION

CROSS-REFERENCE TO RELATED APPLICATIONS

This application is based upon and claims the benefit of priority from U.S. Provisional Application No. 62/306,884, filed on Mar. 11, 2016; the entire contents of which are incorporated herein by reference.

FIELD

Embodiments described herein relate generally to a memory system and a method of controlling thereof.

BACKGROUND

Conventionally, a semiconductor storage device that includes memory cells each retaining a quantity of charges corresponding to a data value has been widely known. Based on a comparison between a threshold voltage corresponding to the quantity of charges retained in a memory cell and a preset read voltage, the data value stored in the memory cell is determined. The quantity of charges retained in the memory cell changes as the time passes and for each access. The data value changes due to a change in the quantity of charges. The changed data value is detected as an error. A technique that enables the read voltage to be shifted according to a change in the quantity of charges has been developed.

BRIEF DESCRIPTION OF THE DRAWINGS

FIG. 14 is a flowchart illustrating an example of an acquisition sequence of SB3 information according to the first embodiment;

FIG. 15 is a flowchart illustrating an example of an acquisition sequence of SB4 information according to the first embodiment;

FIG. 16 is a waveform chart of voltage waveforms used in a single level read in the acquisition sequence of the SB4 information illustrated in FIG. 15;

FIG. 17 is an explanatory diagram of data latch operations performed after a single level read using voltage waveforms illustrated in FIG. 16;

FIG. 18 is a waveform chart of voltage waveforms used in the next single level read in the acquisition sequence of the SB4 information illustrated in FIG. 15;

FIG. 19 is an explanatory diagram of data latch operations performed after a single level read using voltage waveforms illustrated in FIG. 18;

FIG. 26 is a diagram illustrating read levels used in a soft bit read for a LOWER page according to a second embodiment;

FIG. 28 is a diagram illustrating read levels used in a soft bit read for a MIDDLE page according to the second embodiment;

DETAILED DESCRIPTION

In general, according to one embodiment, a memory system includes a non-volatile memory that includes memory cells each being capable of retaining a 4-bit value, a controller that controls a write and a read of data to and from the non-volatile memory, and a decoder that decodes data read from the non-volatile memory, wherein the controller acquires first information on each of a first page to a fourth page from the memory cells and also acquires second information to fifth information on each of the first to fourth pages from the memory cells, and the decoder decodes the first to fifth information related to each of the first to fourth pages.

Exemplary embodiments of a memory system and a method of controlling thereof will be explained below in detail with reference to the accompanying drawings. The present invention is not limited to the following embodiments.

First Embodiment

Figure 1:
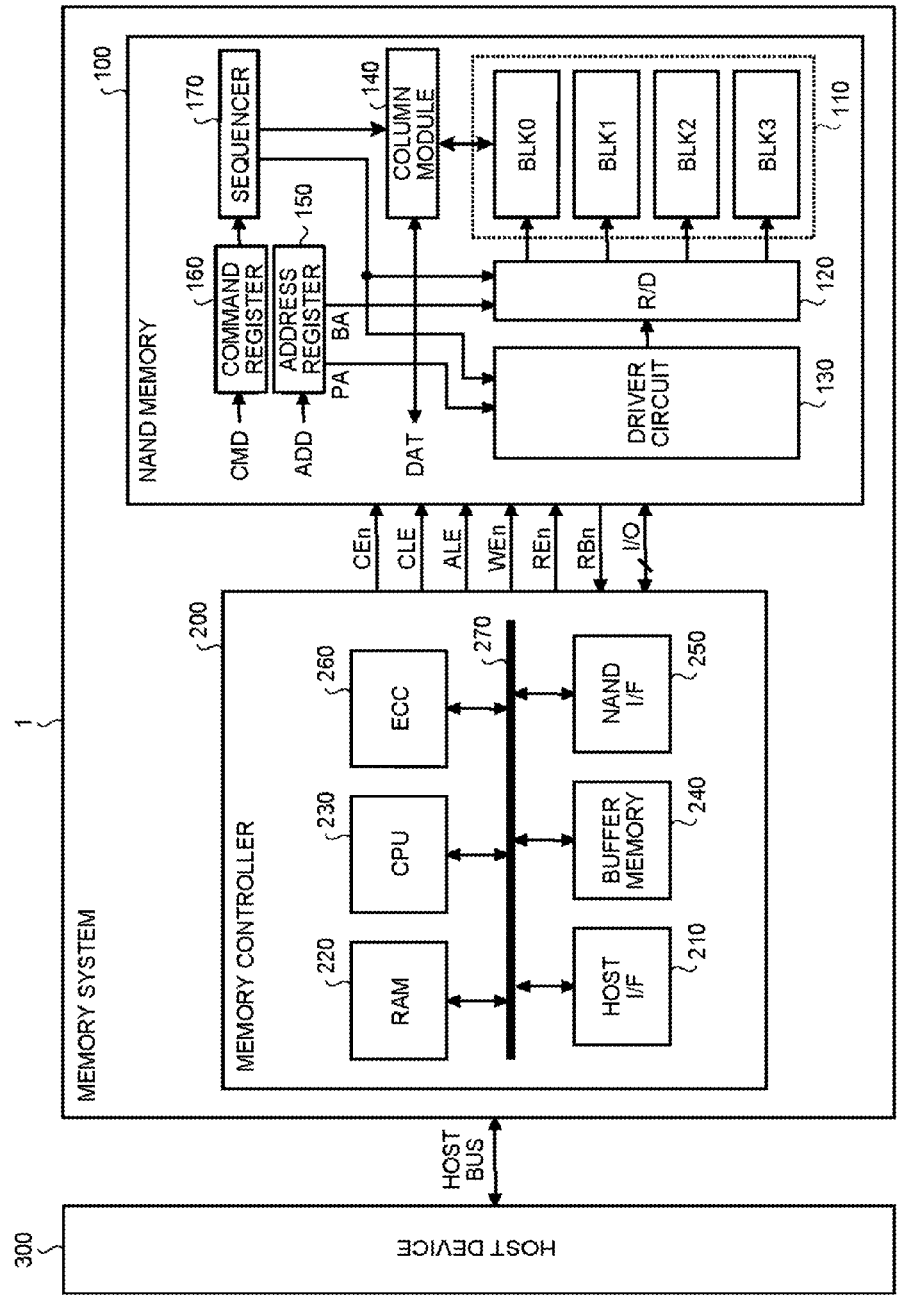
FIG. 1 is a block diagram of a memory system (a semiconductor storage device) according to a first embodiment.

A memory system according to a first embodiment and a method of controlling the memory system are described first in detail with reference to the drawings. FIG. 1 is a block diagram of a memory system (a semiconductor storage device) according to the first embodiment. A memory system 1 includes a NAND flash memory 100 and a memory controller 200. A combination of the NAND flash memory 100 and the memory controller 200 can constitute, for example, one memory system. Examples of the memory system include a memory card such as an SD® card, and an SSD (solid state drive). The NAND flash memory 100 is hereinafter simply referred to as "NAND memory 100".

The NAND memory 100 is a semiconductor storage device according to the first embodiment. The NAND memory 100 is a non-volatile memory including a plurality of memory cells. The memory controller 200 is connected to the NAND memory 100 with a NAND bus and is connected to a host device 300 with a host bus. The memory controller 200 controls the NAND memory 100. The memory controller 200 accesses the NAND memory 100 in response to an instruction received from the host device 300. The host device 300 has a configuration of a computer. The computer can be, for example, a personal computer, a server device, a portable information device, or a digital still camera. Any standards can be adopted as standards to be met by the host bus.

The NAND bus transmits or receives a signal in accordance with a NAND interface. Specific examples of the signal are a chip enable signal CEn, an address-latch enable signal ALE, a command-lath enable signal CLE, a write enable signal WEn, a read enable signal REn, a ready/busy signal RBn, and an input/output signal I/O.

The signal CEn is a signal for enabling the NAND memory 100. The signal CLE is a signal for notifying the NAND memory 100 that an input signal I/O to the NAND memory 100 is a command. The signal ALE is a signal for notifying the NAND memory 100 that an input signal I/O to the NAND memory 100 is an address. The signal WEn is a signal for causing the NAND memory 100 to take in an input signal I/O. The signal REn is a signal for reading an output signal I/O from the NAND memory 100. The ready/busy signal RBn is a signal indicating whether the NAND memory 100 is in a ready state (a state in which the NAND memory 100 can receive an instruction from the memory controller 200) or in a busy state (a state in which the NAND memory 100 cannot receive an instruction from the memory controller 200). The input/output signal I/O is, for example, an 8-bit signal. The input/output signal I/O is a substance of data to be transmitted or received between the NAND memory 100 and the memory controller 200 and is, for example, a command, an address, write data, or read data.

The memory controller 200 includes a host interface circuit (host I/F) 210, a RAM (random access memory) 220, a CPU (central processing unit) 230, a buffer memory 240, a NAND interface circuit (NAND I/F) 250, and an ECC circuit (ECC) 260. The host interface circuit 210, the RAM 220, the CPU 230, the buffer memory 240, the NAND interface circuit 250, and the ECC circuit 260 are connected to each other with an internal bus 270.

The host interface circuit 210 is connected to the host device 300 via the host bus and transfers an instruction and data received from the host device 300 to the CPU 230 and the buffer memory 240, respectively. The host interface circuit 210 also transfers data in the buffer memory 240 to the host device 300 in response to an instruction of the CPU 230.

The CPU 230 controls the entire operation of the memory controller 200. For example, when receiving a write instruction from the host device 300, the CPU 230 issues a write instruction to the NAND interface circuit 250 in response to the received write instruction. Similarly, at the time of a read and an erase, when receiving a read instruction from the host device 300, the CPU 230 issues a read instruction to the NAND interface circuit 250 in response to the received read instruction. The CPU 230 also performs various types of processing for managing the NAND memory 100, such as wear leveling and garbage collection.

The NAND interface circuit 250 is connected to the NAND memory 100 via the NAND bus and controls communication with the NAND memory 100. The NAND interface circuit 250 outputs the signal ALE, the signal CLE, the signal WEn, and the signal REn to the NAND memory 100 based on an instruction received from the CPU 230. At the time of a write, the NAND interface circuit 250 transfers a write command issued by the CPU 230 and write data in the buffer memory 240 to the NAND memory 100 as the input/output signal I/O. At the time of a read, the NAND interface circuit 250 transfers a read command issued by the CPU 230 to the NAND memory 100 as the input/output signal I/O. The NAND interface circuit 250 also receives data read from the NAND memory 100 as the input/output signal I/O and transfers the received data to the buffer memory 240.

The buffer memory 240 functions as a memory area in which write data or read data is temporarily retained. The buffer memory 240 is constituted of a DRAM (dynamic random access memory) or an SRAM (static random access memory).

The RAM 220 is a semiconductor memory such as a DRAM. The RAM 220 is used as a working area of the CPU 230. Firmware for managing the NAND memory 100, various management tables, and the like are loaded to the RAM 220.

The ECC circuit 260 codes and decodes data for error detection and error correction of read data. Specifically, the ECC circuit 260 codes data to be written to the NAND memory 100. The ECC circuit 260 also decodes data read from the NAND memory 100. The ECC circuit 260 performs error detection and error correction of read data by decoding. When having failed in error correction, the ECC circuit 260 notifies the CPU 230 of a failure of the error correction. Any algorithm can be adopted as an algorithm for coding and decoding performed by the ECC circuit 260.

For example, the ECC circuit 260 generates a parity based on data and adds the parity to the data. At the time of a write, the data added with the parity is written to the NAND memory 100 as coded data. At the time of a read, the ECC circuit 260 generates a syndrome based on the parity and determines whether there is an error in data. When an error is included in the data, the ECC circuit 260 specifies the position of the error and corrects the error. The number of errors that can be corrected by the ECC circuit 260 depends on the number of bits of the parity, for example. When errors more than the number of correctable errors are included in data, the ECC circuit 260 cannot correct the errors. That is, the ECC circuit 260 fails in the error correction.

The NAND memory 100 includes a memory cell array 110, a row decoder (R/D) 120, a driver circuit 130, a column module 140, an address register (ADD register) 150, a command register (CMD register) 160, and a sequencer 170.

The memory cell array 110 includes a plurality of blocks. In the example illustrated in FIG. 1, the memory cell array 110 includes four blocks BLK (BLK0 to BLK3). Each of the blocks BLK is a collection of non-volatile memory cells (memory cell transistors MT) and each of the memory cells is associated with a row and a column. The memory cell array 110 stores therein data provided from the memory controller 200.

The row decoder 120 selects one of the blocks BLK0 to BLK3 and further selects a row direction in the selected block BLK.

The driver circuit 130 supplies a voltage to the selected block BLK via the row decoder 120.

Figure 2:
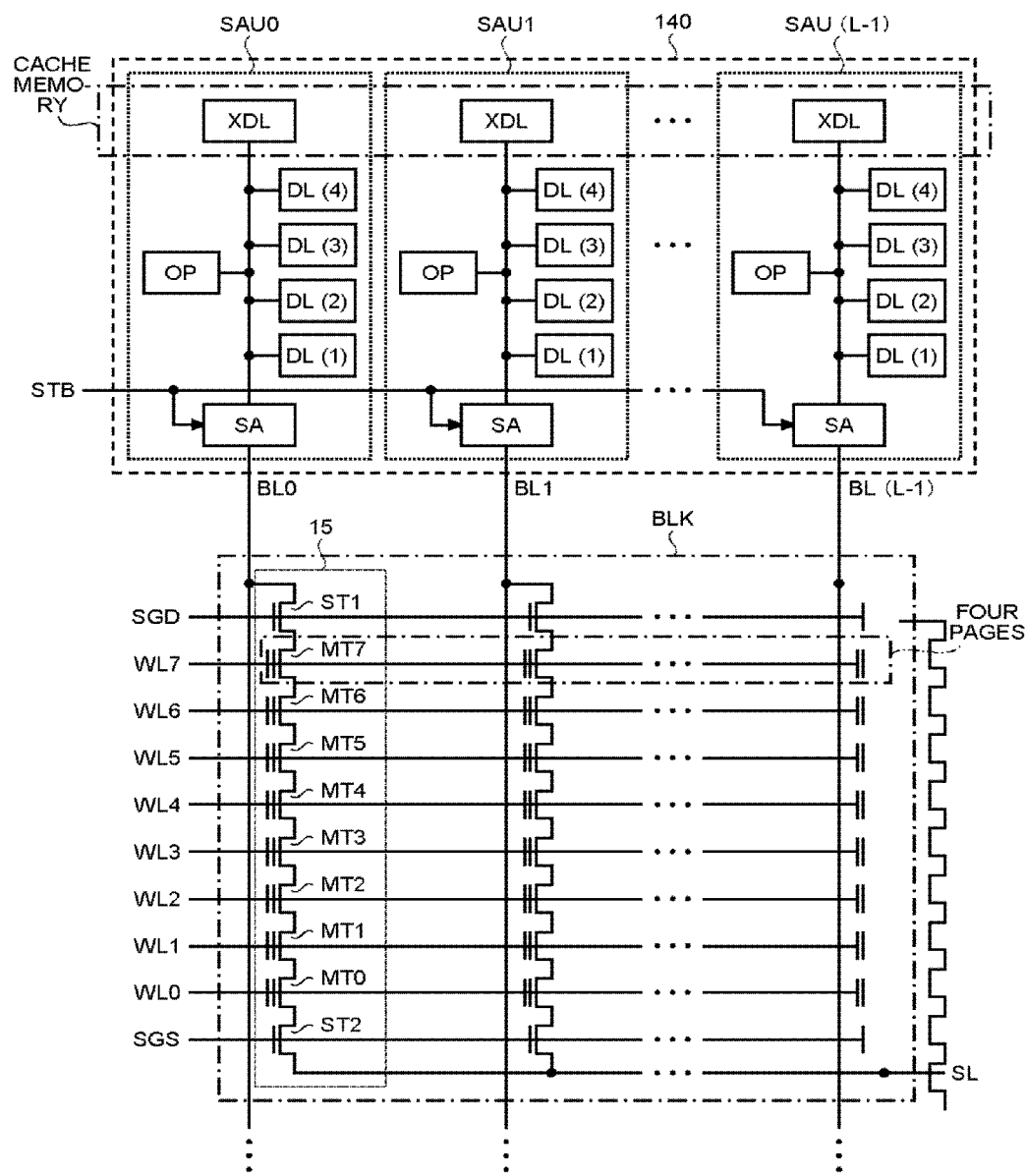
FIG. 2 is a circuit diagram of a block and a sense amplifier according to the first embodiment.

The column module 140 is configured to include, for example, a sense amplifier and a data latch including a plurality of latch circuits (see FIG. 2). In write processing, the column module 140 transfers write data DAT received from the memory controller 200 to the memory cell array 110. In read processing, the column module 140 senses data read from the memory cell array 110 and performs necessary arithmetic. The column module 140 then outputs resultant data DAT to the memory controller 200.

The address register 150 retains an address ADD received from the memory controller 200. The command register 160 retains a command CMD received from the memory controller 200.

The sequencer 170 controls the entire operation of the NAND memory 100 based on the command CMD retained in the command register 160.

FIG. 2 is a circuit diagram of the blocks BLK and the column module 140.

The blocks BLK respectively includes a plurality of NAND strings 15. Each of the NAND strings 15 includes, for example, eight memory cells (memory cell transistors MT0 to MT7) and selective transistors ST1 and ST2. Each of the memory cell transistors MT includes a control gate and a floating gate. The memory cell transistors MT are connected in series between a source of the selective transistor ST1 and a drain of the selective transistor ST2. Charges are input to the floating gate of each of the memory cell transistors MT by the column module 140 to cause the threshold voltage to correspond to one of plural threshold regions according to data. The threshold voltages of the memory cell transistors MT are converted to data by the column module 140. Data coding is described later.

Gates of the selective transistors ST1 and ST2 in the same block are connected in common to select gate lines SGD and SGS, respectively. Similarly, the control gates of the memory cell transistors MT0 to MT7 in the same block are connected in common to word lines WL0 to WL7, respectively.

Drains of the selective transistors ST1 of the NAND strings 15 in the same column in the memory cell array 110 are connected in common to a bit line BL (BL0 to BL(L−1), (L−1) is a natural number equal to or larger than 1). That is, the bit line BL connects the NAND strings 15 in the blocks BLK in common. Sources of the selective transistors ST2 are connected to a source line SL in common.

The memory cell array 110 may have a configuration in which the memory cell transistors MT are three-dimensionally stacked above a semiconductor substrate. Such a configuration is described, for example, in U.S. patent application Ser. No. 12/407,403 (currently, U.S. Pat. No. 8,952,426) filed on Mar. 19, 2009 and titled "Three dimensional stacked nonvolatile semiconductor memory". The configuration is also described in U.S. patent application Ser. No. 12/406,524 (currently, U.S. Pat. No. 7,852,675) filed on Mar. 18, 2009 and titled "Three dimensional stacked nonvolatile semiconductor memory", U.S. patent application Ser. No. 12/679,991 (US Patent Application Laid-open No. 2010/0207195) filed on Mar. 25, 2010 and titled "Non-volatile semiconductor storage device and method of manufacturing the same", and U.S. patent application Ser. No. 12/532,030 (US Patent Application Laid-open No. 2011/0284946) filed on Mar. 23, 2009 and titled "Semiconductor memory and method for manufacturing same". The entireties of these patent applications are incorporated in the specification of the present application by reference.

The memory cell transistors MT are hereinafter simply referred to as "memory cells".

Figure 3:
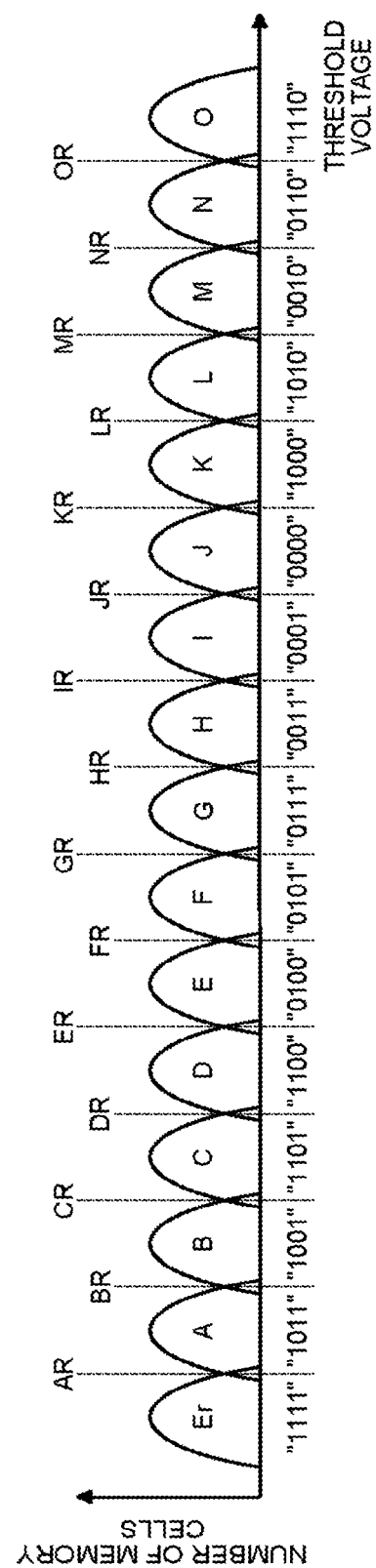
FIG. 3 is a diagram illustrating an example of data coding and threshold voltage distributions according to the first embodiment.

FIG. 3 is a diagram illustrating an example of data coding and threshold voltage distributions according to the first embodiment. In the first embodiment, one memory cell can retain therein 4-bit data. That is, the memory cells in the first embodiment are QLCs (quadruple level cells). In FIG. 3, the horizontal axis represents the threshold voltage of memory cells and the vertical axis represents the number (or the frequency) of the memory cells. Gaussian distributions Er to O illustrated in FIG. 3 schematically depict distributions (threshold voltage distributions) of threshold voltage levels of memory cells to which respective values have been written.

Figure 4:
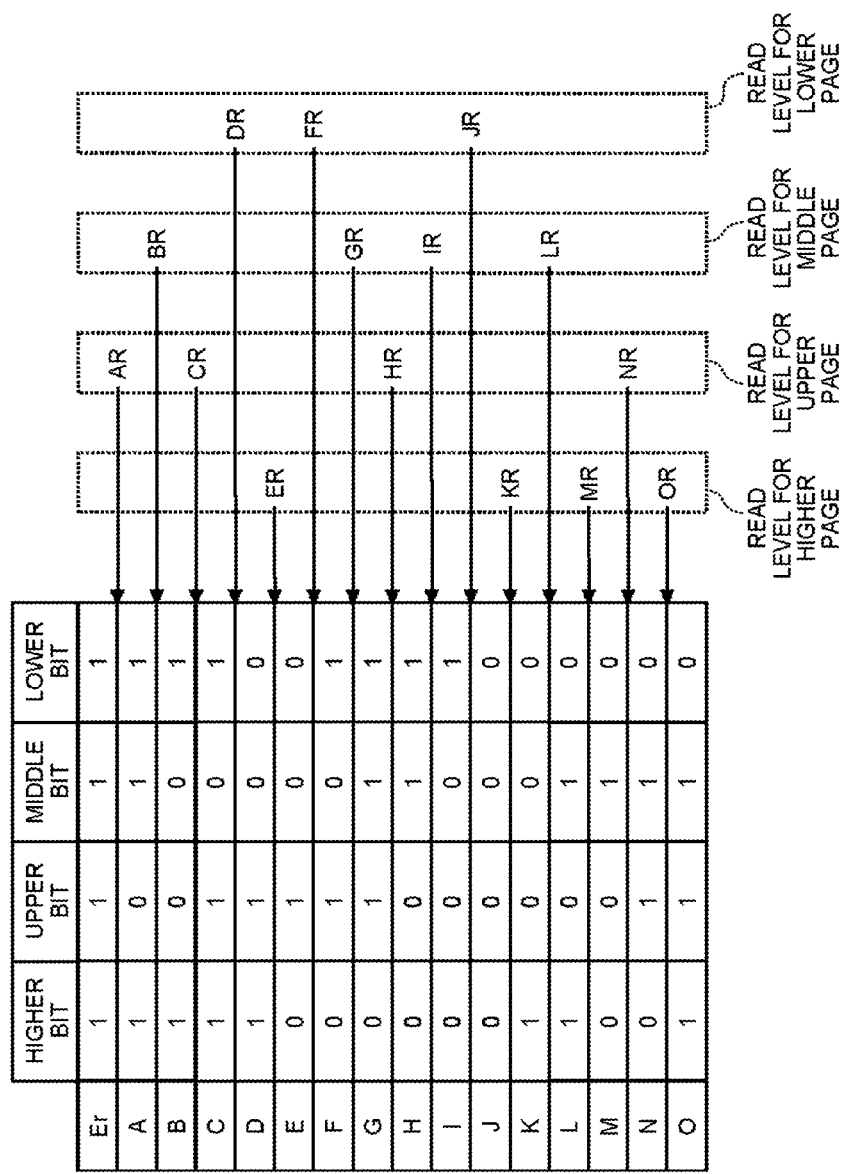
FIG. 4 illustrates a correspondence relation of distributions illustrated in FIG. 3 and 4-bit data values.

In the memory cells being the QLCs, programs for the memory cells are executed to cause the threshold voltages to be included in any of the distribution Er, a distribution A, a distribution B, a distribution C, a distribution D, a distribution E, a distribution F, a distribution G, a distribution H, a distribution I, a distribution J, a distribution K, a distribution L, a distribution M, a distribution N, and the distribution O. These 16 distributions correspond to 4-bit data values, respectively. FIG. 4 illustrates an example of a correspondence relation of the distributions illustrated in FIG. 3 and 4-bit data values. According to the example illustrated in FIG. 4, the distribution Er corresponds to a data value "1111", the distribution A corresponds to a data value "1011", the distribution B corresponds to a data value "1001", the distribution C corresponds to a data value "1101", the distribution D corresponds to a data value "1100", the distribution E corresponds to a data value "0100", the distribution F corresponds to a data value "0101", the distribution G corresponds to a data value "0111", the distribution H corresponds to a data value "0011", the distribution I corresponds to a data value "0001", the distribution J corresponds to a data value "0000", the distribution K corresponds to a data value "1000", the distribution L corresponds to a data value "1010", the distribution M corresponds to a data value "0010", the distribution N corresponds to a data value "0110", and the distribution O corresponds to a data value "1110".

As illustrated in FIG. 4, among the four bits of data retained in one memory cell transistor MT, an LSB (least significant bit) is referred to as "LOWER bit", an MSB (most significant bit) is referred to as "HIGHER bit", and two bits between the LSB and the MSB are referred to as "MIDDLE bit" and "UPPER bit", respectively.

A set of LOWER bit information of all memory cell transistors MT connected to the same word line WL is referred to as "LOWER page". A set of MIDDLE bit information of all memory cell transistors MT connected to the same word line WL is referred to as "MIDDLE page". A set of UPPER bit information of all memory cell transistors MT connected to the same word line WL is referred to as "UPPER page". A set of HIGHER bit information of all memory cell transistors MT connected to the same word line WL is referred to as "HIGHER page". That is, four pages are assigned to one word line WL. Write processing and read processing for the memory cell array 110 are performed, for example, in units of pages. Erase processing for the memory cell array 110 is performed in units of the blocks BLK.

As illustrated in FIGS. 3 and 4, a voltage of a boundary (hereinafter, "boundary voltage") between the distribution Er and the distribution A, a boundary voltage between the distribution A and the distribution B, a boundary voltage between the distribution B and the distribution C, a boundary voltage between the distribution C and the distribution D, a boundary voltage between the distribution D and the distribution E, a boundary voltage between the distribution E and the distribution F, a boundary voltage between the distribution F and the distribution G, a boundary voltage between the distribution G and the distribution H, a boundary voltage between the distribution H and the distribution I, a boundary voltage between the distribution I and the distribution J, a boundary voltage between the distribution J and the distribution K, a boundary voltage between the distribution K and the distribution L, a boundary voltage between the distribution L and the distribution M, a boundary voltage between the distribution M and the distribution N, and a boundary voltage between the distribution N and the distribution O are denoted by AR (or AR4), BR (or BR4), CR (or CR4), DR (or DR4), ER (or ER4), FR (or FR4), GR (or GR4), HR (or HR4), IR (or IR4), JR (or JR4), KR (or KR4), LR (or LR4), MR (or MR4), NR (or NR4), and OR (or OR4), respectively. These boundary voltages are used to determine a data value during read processing.

The data coding illustrated in FIGS. 3 and 4 is an example and the data coding is not limited to the example illustrated in FIGS. 3 and 4.

The column module 140 includes sense amplifier units SAU (SAU0 to SAU(L−1)) provided for bit lines BL, respectively, as illustrated in FIG. 2.

Each of the sense amplifier units SAU detects (senses) whether the relevant memory cell transistors MT are brought to a conduction state (an on-state) or a non-conduction state (an off-state) in response to application of voltages to the word lines WL by the row decoder 120, and determines data values based on sensing results. Specifically, the sense amplifier unit SAU precharges the relevant bit line BL with a predetermined precharge potential Vb1 (0.7 volt, for example), and the row decoder 120 applies plural types of boundary voltages in turns as a read level to a selected word line WL (hereinafter, "selective word line WL"). The row decoder 120 applies a transfer potential VREAD to non-selective word lines WL (hereinafter, "non-selective word lines WL") to bring memory cells belonging to the non-selective word lines WL to a conduction state. The sense amplifier unit SAU determines a data value stored in a target memory cell by detecting which of the applied boundary voltages causes charges accumulated by the precharging to flow out to the source line SL.

An example of the method of determining a data value in normal read processing is described below.

In the present descriptions, a normal read operation using the boundary voltages AR to OR described above is referred to as "normal read (or NR read)". Processing of applying a single read level and determining whether charges flow out to the source line SL is referred to as "single level read". A single level read in which a read level is set at the middle of a distribution X and a distribution Y adjacent to the distribution X is referred to as "X read". The distribution X is assumed to be higher than the distribution Y. That is, X is any one of A to O and Y is any one of Er to N. In the X read, a sense result detected by a sense amplifier SA in a case where charges have flowed out to the source line SL (that is, a case where the target memory cell is in an on-state) is "0", and a sense result detected by a sense amplifier SA in a case where charges have not flowed out to the source line SL (that is, a case where the target memory cell is kept in an off-state) is "1". Which of "0" and "1" is to be assigned to each of the cases is not limited to this example. The A read to the O read may be referred to as "types of the single level read", respectively.

In the following descriptions, processing of reading information of one page in response to a read instruction for one page and returning the read information is referred to as "hard bit read (also, HB read)" and the information read in the hard bit read is referred to as "hard bit information (also, HB information)". In the hard bit read, the boundary voltages AR (or AR4) to OR (or OR4) described above are used as read level levels. Therefore, information read in the normal read described above is also hard bit information (HB information). A read operation in which an offset is set in a read level that is to be used in an operation identical to the hard bit read is referred to as "shift read (also, SH read)". Information read in the shift read is also hard bit information (HB information). Furthermore, processing of reading information of plural pages in response to a read instruction for one page and returning the read information is referred to as "soft bit read (also, SB read)" and information read in the soft bit read is referred to as "soft bit information (also, SB information)". In the soft bit read, plural boundary voltages that are set for each of the boundary voltages AR (or AR4) to OR (or OR4) to be used in the hard bit read are used as read level levels.

The descriptions are continued by referring back to FIG. 2. As illustrated in FIG. 2, each of the sense amplifier units SAU includes the sense amplifier SA, an operation unit OP, and a plurality of latch circuits. As an example, each of the sense amplifier units SAU includes a latch circuit DL(1), a latch circuit DL(2), a latch circuit DL(3), a latch circuit DL(4), and a latch circuit XDL.

The sense amplifier SA applies a voltage according to write data to the relevant bit line BL. The sense amplifier SA senses whether charges have flowed out to the source line SL. A control signal STB is provided to the sense amplifier SA by, for example, the sequencer 170. The sense amplifier SA confirms the result ("0" or "1") of sensing at a timing when the signal STB is asserted and transfers the confirmed result to the latch circuit DL(1).

The latch circuit DL(1), the latch circuit DL(2), the latch circuit DL(3), the latch circuit DL(4), and the latch circuit XDL temporarily retain therein data of a sensing result, read data, write data, and data of a result of an operation by the operation unit OP. The operation unit OP performs various logical operations such as a negation operation, a logical disjunction operation, a logical conjunction operation, an exclusive disjunction (XOR) operation, and an exclusive negative disjunction (ENOR) operation with respect to data retained in the latch circuit DL(1), the latch circuit DL(2), the latch circuit DL(3), the latch circuit DL(4), and the latch circuit XDL.

The sense amplifier SA, the latch circuit DL(1), the latch circuit DL(2), the latch circuit DL(3), the latch circuit DL(4), the latch circuit XDL, and the operation unit OP are connected with a bus to enable transmission and reception of data to and from each other.

Input/output of data to and from the column module 140 is performed via the latch circuit XDL. That is, data received from the memory controller 200 is transferred via the latch circuit XDL to the latch circuit DL(1), the latch circuit DL(2), the latch circuit DL(3), the latch circuit DL(4), or the sense amplifier SA. Data in the latch circuit DL(1), the latch circuit DL(2), the latch circuit DL(3), the latch circuit DL(4), or the sense amplifier SA is transmitted to the memory controller 200 via the latch circuit XDL. There is also a mode in which the latch circuit XDL is used as a cache memory of the NAND memory 100. That is, even when any of the latch circuit DL(1), the latch circuit DL(2), the latch circuit DL(3), and the latch circuit DL(4) is being used during an access (programming, reading, or erasing) to the memory cell array 110, the NAND memory 100 can be in a ready state if reading/writing can be performed by the latch circuit XDL.

Figure 5:
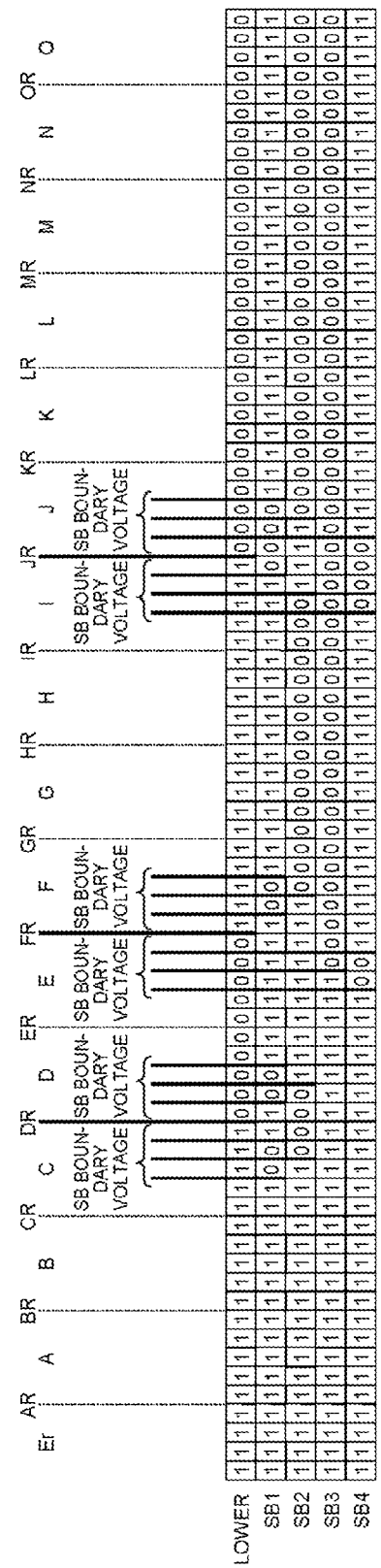
FIG. 5 is a diagram illustrating read levels used when a LOWER page according to the first embodiment is to be read, and data values obtained by respective reads.
Figure 6:
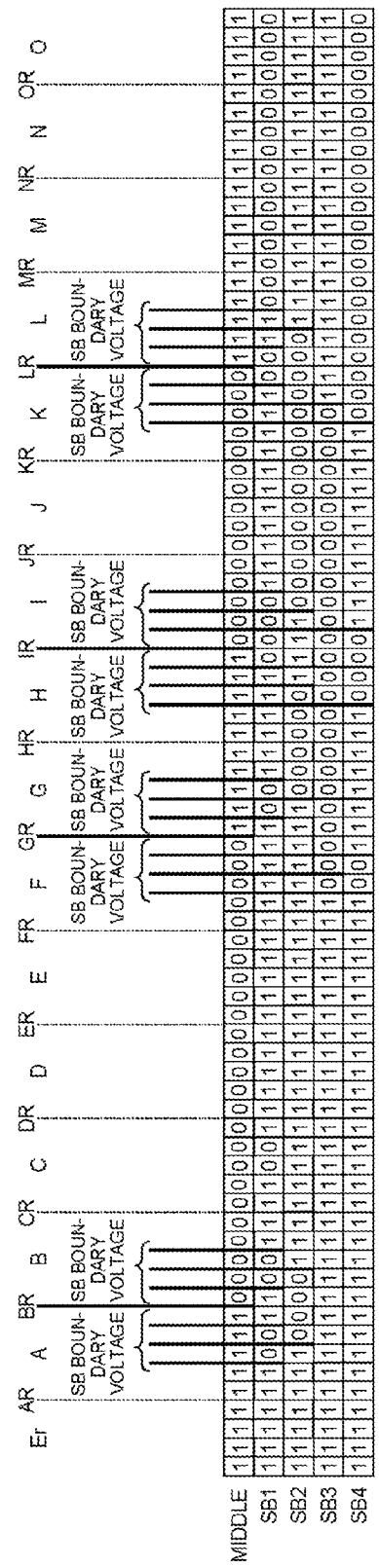
FIG. 6 is a diagram illustrating read levels used when a MIDDLE page according to the first embodiment is to be read, and data values obtained by respective reads.
Figure 7:
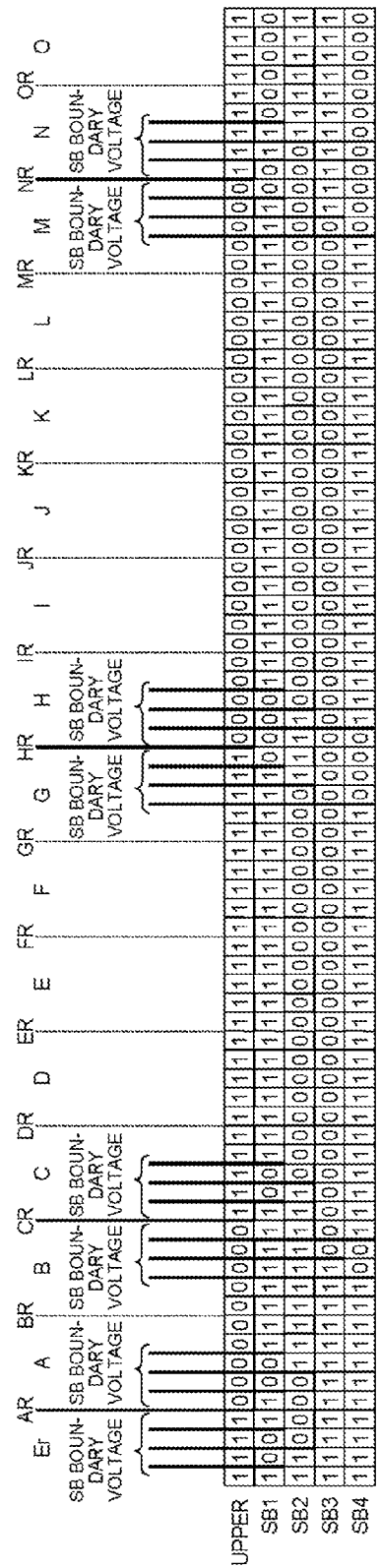
FIG. 7 is a diagram illustrating read levels used when an UPPER page according to the first embodiment is to be read, and data values obtained by respective reads.
Figure 8:
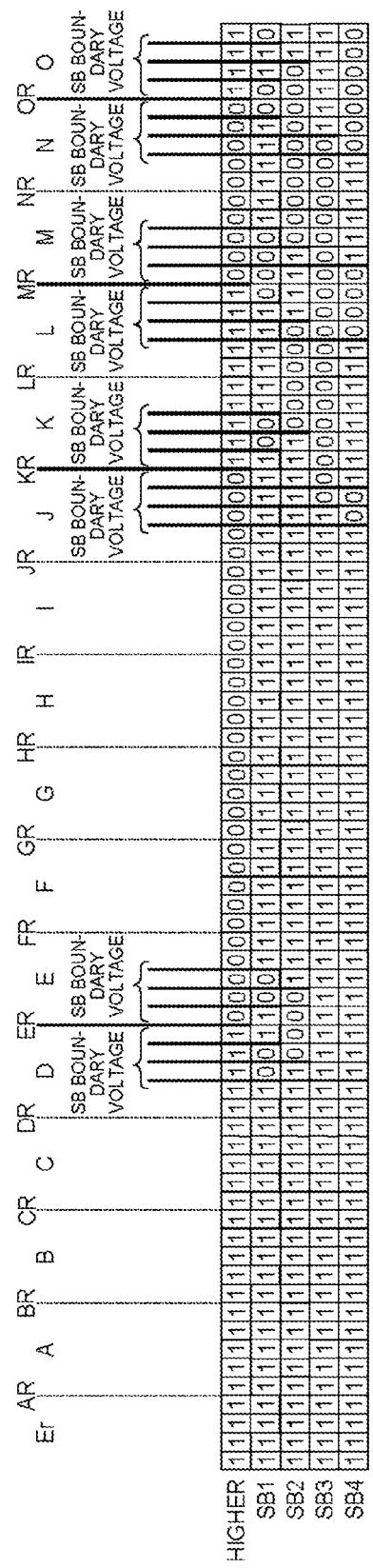
FIG. 8 is a diagram illustrating read levels used when a HIGHER page according to the first embodiment is to be read, and data values obtained by respective reads.

The boundary voltages used as the read levels when respective pages are to be read, and data values read using the boundary voltages are described next with reference to FIGS. 5 to 8. FIG. 5 is a diagram illustrating read levels used when a LOWER page is to be read, and data values obtained by respective reads. FIG. 6 is a diagram illustrating read levels used when a MIDDLE page is to be read, and data values obtained by respective reads. FIG. 7 is a diagram illustrating read levels used when an UPPER page is to be read, and data values obtained by respective reads. FIG. 8 is a diagram illustrating read levels used when a HIGHER page is to be read, and data values obtained by respective reads. FIGS. 5 to 8 illustrate also SB information (SB1 to SB4) obtained by a soft bit read described later as well as HB information (LOWER, MIDDLE, UPPER, and HIGHER) obtained by a hard bit read described later.

As illustrated in FIG. 5, in a read of a LOWER page, the boundary voltages DR, FR, and JR are used as the read levels. That is, in a hard bit read for a LOWER page, three types of single level reads (D read, F read, and J read), in other words, three times of single level reads are performed. DR is used as the read level in the D read, FR is used as the read level in the F read, and JR is used as the read level in the J read. The sense amplifier units SAU determine that memory cells from which flow-out of charges to the source line SL is detected in the D read have a data value "1". The sense amplifier units SAU determine that memory cells from which flow-out of charges to the source line SL is detected in the F read among memory cells from which flow-out of charges is not detected in the D read have a data value "0". The sense amplifier units SAU further determine that memory cells from which flow-out of charges to the source line SL is detected in the J read among memory cells from which flow-out of charges is not detected in either the D read or the F read have a data value "1". The sense amplifier units SAU further determine that memory cells from which flow-out of charges is not detected in any of the D read, the F read, and the J read have a data value "0". By thus performing the arithmetic described above to the data values obtained by three times of single level reads in which the read level is changed to the boundary voltages DR, FR, and JR in turn, data values (LOWER) of the LOWER page can be set in the corresponding latch circuits XDL.

As illustrated in FIGS. 6 to 8, also for other read target pages (MIDDLE, UPPER, and HIGHER), data values (MIDDLE, UPPER, and HIGHER) of the respective pages can be obtained similarly to the LOWER page. However, four types of single level reads, in other words, four times of single level reads are performed in each of the hard bit reads for the MIDDLE page, the UPPER page, and the HIGHER page. For example, in the hard bit read for the MIDDLE page illustrated in FIG. 6, a total of four times of single level reads including the B read using BR as the read level, the G read using GR as the read level, the I read using the IR as the read level, and the L read using LR as the read level are performed. In the hard bit read for the UPPER page illustrated in FIG. 7, a total of four times of single level reads including the A read using AR as the read level, the C read using CR as the read level, the H read using HR as the read level, and the N read using NR as the read level are performed. Further, in the hard bit read for the HIGHER page illustrated in FIG. 8, a total of four times of single level reads including the E read using ER as the read level, the K read using KR as the read level, the M read using MR as the read level, and the O read using OR as the read level are performed.

Figure 9:
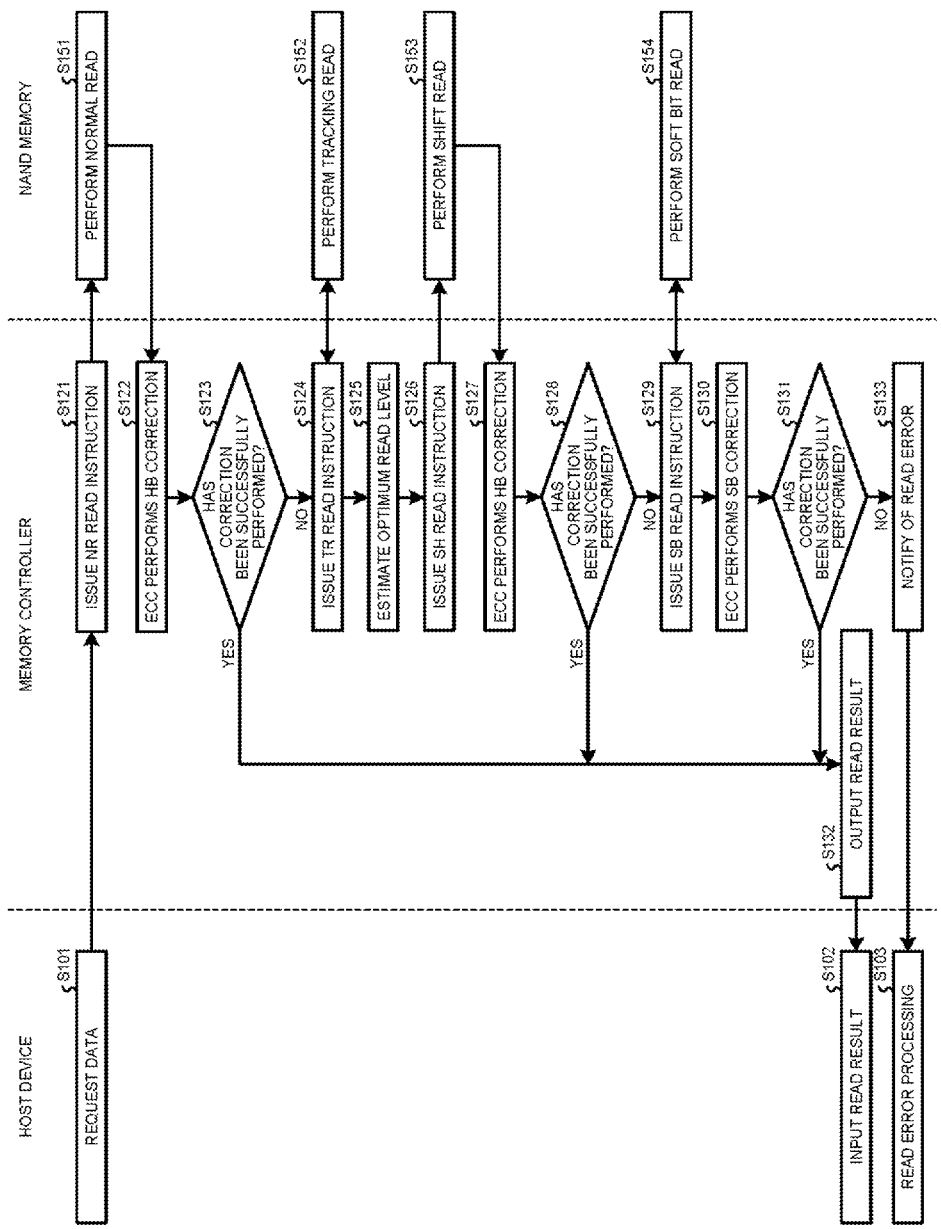
FIG. 9 is a flowchart illustrating an operation example of the memory system according to the first embodiment at the time of reads.

An operation of the memory system 1 according to the first embodiment is described in detail next with reference to the drawings. FIG. 9 is a flowchart illustrating an operation example of the memory system according to the first embodiment at the time of reads.

As illustrated in FIG. 9, when a data read request is output from the host device 300 (Step S101), the CPU 230 of the memory controller 200 converts a logical address of read target data notified by the host device 300 together with the read request to a block address and a page address of a memory area in which the read target data is stored, and issues a normal read (NR read) instruction on the memory area designated by the addresses to the NAND memory 100 (Step S121).

The NR read instruction issued by the CPU 230 is stored in, for example, the command register 160 of the NAND memory 100. In response thereto, the sequencer 170 performs a normal read (Step S151). Accordingly, data values (hereinafter, "HB information") read from the memory area designated by the block address and the page address by the normal read are stored in the corresponding latch circuits XDL (see FIG. 2) in the NAND memory 100.

The HB information stored in the latch circuits XDL is temporarily stored in the buffer memory 240 by the memory controller 200. The ECC circuit 260 in the memory controller 200 performs error detection for the HB information stored in the buffer memory 240 and, when there is an error, performs error correction to correct the error (Step S122). When there is no error or the error correction has been successfully performed (YES at Step S123), the CPU 230 outputs the error-detected or error-corrected HB information as a read result to the host device 300 (Step S132). In this way, data requested at Step S101 is input to the host device 300 (S102).

When a result of determination at Step S123 indicates that the error correction by the ECC circuit 260 has failed (NO at Step S123), the CPU 230 can perform, for example, estimation processing of estimating an optimum read level before performing a soft bit read. An optimum read level is a read level that minimizes a bit error rate in read data and is normally a threshold voltage corresponding to a bottom-most point of a valley formed by adjacent two threshold voltage distributions among the threshold voltage distributions (the distributions Er to O) illustrated as an example in FIG. 3. However, the threshold voltage distributions (the distributions Er to O) illustrated as an example in FIG. 3 shift toward a low voltage side (a high voltage side in some cases) as a result of time degradation of memory cells due to read/write stress or other factors. Therefore, an optimum read level for distinguishing adjacent two threshold voltage distributions also shifts according to a shift of the threshold voltage distributions (the distributions Er to O). In such a case, the estimation processing of estimating an optimum read level may be performed.

While various operations can be applied as a specific operation of the estimation processing for an optimum read level, a method of performing a tracking read is described as an example thereof. The tracking read can be, for example, a process of performing the single level read plural times while changing the read level with predetermined step sizes, thereby to generate a distribution histogram (a threshold voltage distribution) of threshold voltages programmed in memory cells included in a relevant page.

In the estimation processing, the CPU 230 issues a tracking read (TR read) instruction, which is an instruction to request a tracking read (TR read), and transmits the TR read instruction to the NAND memory 100 (Step S124). At this time, the CPU 230 can transmit the same block address and page address as those in the NR read instruction to the NAND memory 100. In response thereto, the sequencer 170 performs the tracking read (Step S152). Subsequently, the CPU 230 estimates an optimum read level from a read result obtained by the tracking read (Step S125). While various methods can be applied as a method of estimating an optimum read level, a method of estimating an optimum read level from plural peak positions in generated threshold voltage distributions or the like can be used, for example.

Next, the CPU 230 issues a shift read (SH read) instruction, which is an instruction to request a shift read using the estimated optimum read level, and transmits the SH read instruction to the NAND memory 100 (Step S126). At this time, the CPU 230 can transmit the same block address and page address as those in the NR read instruction to the NAND memory 100.

In response to the SH read instruction, the sequencer 170 performs a hard bit read (shift read) using the optimum read level estimated at Step S125 (Step S153). In the shift read at Step S153, the hard bit read using the optimum read level estimated at Step S125 is performed. The column module 140 stores data values (HB information) obtained by the shift read in the corresponding latch circuits XDL. When the memory controller 200 inputs the HB information stored in the latch circuits XDL, the input HB information is tempo-rarily stored in the buffer memory 240 and then the ECC circuit 260 in the memory controller 200 performs error detection for the HB information. When there is an error, the ECC circuit 260 performs error correction to correct the error (Step S127). When there is no error or when error correction has been successfully performed (YES at Step S128), the CPU 230 outputs the error-detected or error-corrected HB information as a read result to the host device 300 (Step S132). Accordingly, data requested at Step S101 is input to the host device 300 (Step S102).

On the other hand, when a result of determination at Step S128 indicates that the error correction by the ECC circuit 260 has failed (NO at Step S128), the CPU 230 issues a soft bit read (SB read) instruction, which is an instruction to request a soft bit read, and transmits the SB read instruction to the NAND memory 100 (Step S129). At this time, the CPU 230 can transmits the same block address and page address as those in the NR read instruction to the NAND memory 100.

The SB read instruction issued by the CPU 230 is stored in, for example, the command register 160 in the NAND memory 100. In response thereto, the sequencer 170 performs a soft bit read (Step S154). Details of the soft bit read are described later. By performing the soft bit read, data values of a total of five pages including the HB information of one page read from the memory area designated by the block address and the page address and the soft bit information (hereinafter, "SB1 information to SB4 information" or "SB information") of four pages are obtained sequentially from the latch circuits XDL (see FIG. 2) in the NAND memory 100.

The data values (the HB information and the SB information) obtained sequentially from the latch circuits XDL are read by the CPU 230 of the memory controller 200 and are temporarily stored in the buffer memory 240. The ECC circuit 260 of the memory controller 200 performs soft-decision decoding using the data values (the HB information and the SB information) stored in the buffer memory 240 (Step S130). When this decoding has been successfully performed (YES at Step S131), the CPU 230 outputs user data obtained by the decoding as a read result to the host device 300 (Step S132). In this way, data requested at Step S101 is input to the host device 300 (Step S102).

On the other hand, when a result of determination at Step S131 indicates that the decoding by the ECC circuit 260 has failed (NO at Step S131), the CPU 230 notifies the host device 300 of a failure of the read (Step S133). In response thereto, the host device 300 performs read error processing such as notification to a user of the failure of the read (Step S103).

Figure 10:
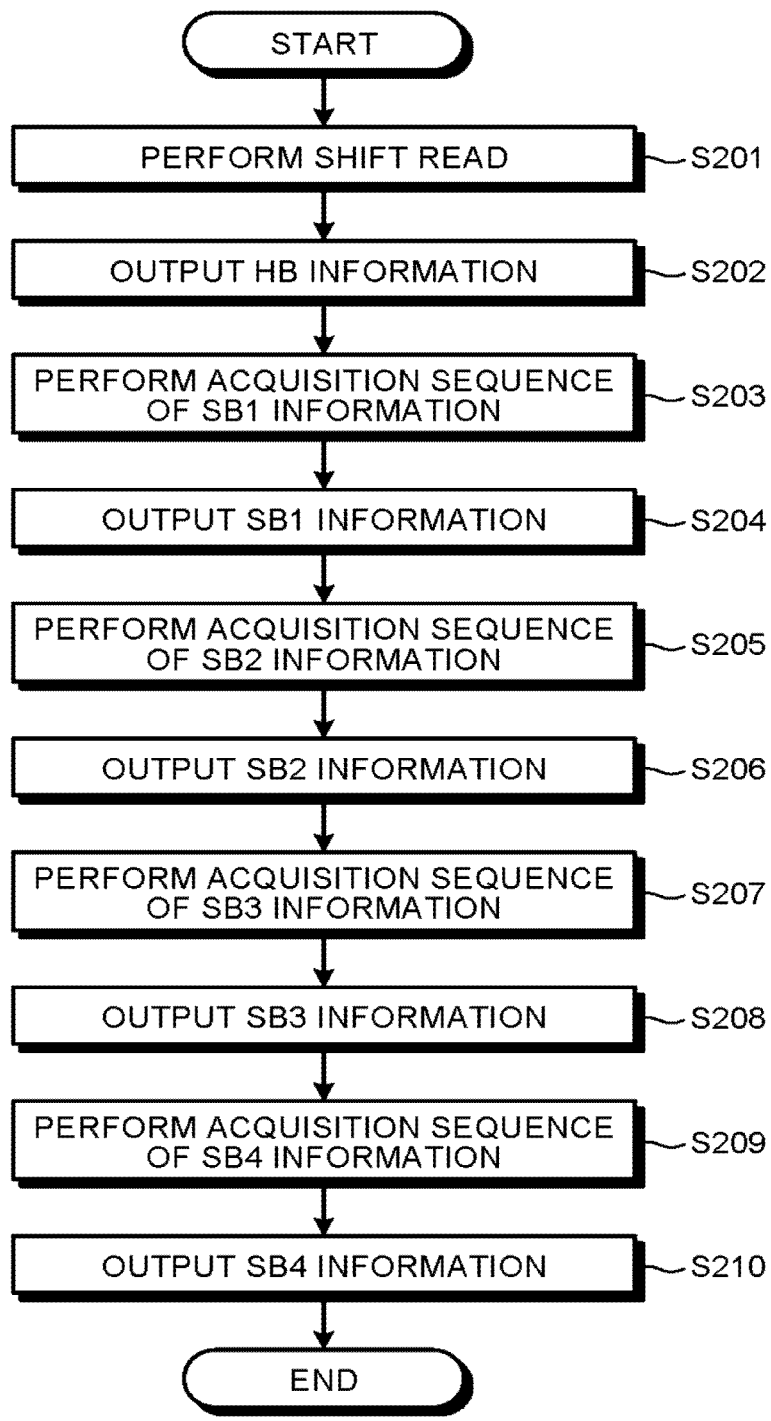
FIG. 10 is a flowchart illustrating an example of a main flow of a soft bit read according to the first embodiment.

A specific operation example of the soft bit read according to the first embodiment is explained in detail next with reference to the drawings. FIG. 10 is a flowchart illustrating an example of a main flow of the soft bit read according to the first embodiment. An operation illustrated in FIG. 10 is performed for each of the LOWER page, the MIDDLE page, the UPPER page, and the HIGHER page illustrated in FIGS. 5 to 8.

As illustrated in FIG. 10, the sequencer 170 of the NAND memory 100 having received an SB read instruction first performs a hard bit read (shift read) using the optimum read level estimated at Step S125 in FIG. 9 (Step S201), and outputs HB information thus stored in the latch circuits XDL to the CPU 230 (Step S202). When the HB information obtained by the shift read at Step S153 in FIG. 9 is saved in, for example, the cache memory (see FIG. 2) in the NAND memory 100, processes at Steps S201 and S202 in FIG. 10 can be omitted.

Next, the sequencer 170 performs an operation (an acquisition sequence) to acquire SB information (SB1 information) of a first page (Step S203) and outputs the SB1 information thus stored in the latch circuits XDL to the CPU 230 (Step S204). The acquisition sequence of the SB1 information at Step S203 is described later with reference to FIG. 12.

Subsequently, the sequencer 170 performs an operation (an acquisition sequence) to acquire SB information (SB2 information) of a second page (Step S205) and outputs the SB2 information thus stored in the latch circuits XDL to the CPU 230 (Step S206). The acquisition sequence of the SB2 information at Step S205 is described later with reference to FIG. 13.

Next, the sequencer 170 performs an operation (an acquisition sequence) to acquire SB information (SB3 information) of a third page (Step S207) and outputs the SB3 information thus stored in the latch circuits XDL to the CPU 230 (Step S208). The acquisition sequence of the SB3 information at Step S207 is described later with reference to FIG. 14.

Subsequently, the sequencer 170 performs an operation (an acquisition sequence) to acquire SB information (SB4 information) of a fourth page (Step S209) and outputs the SB4 information thus stored in the latch circuits XDL to the CPU 230 (Step S210). The present operation is then ended. The acquisition sequence of the SB4 information at Step S209 is described later with reference to FIG. 15.

The acquisition sequences of the SB1 information to the SB4 information described with reference to FIG. 10 are described next. In the present descriptions, attention is focused on the MIDDLE page to which four acquisition sequences including the acquisition sequence of the SB1 information to the acquisition sequence of the SB4 information are performed. However, the descriptions can be applied similarly to the LOWER page, the UPPER page, and the HIGHER page to which four acquisition sequences are similarly performed when the read level to be used in the respective acquisition sequences is changed to correspond to the relevant page.

Figure 11:
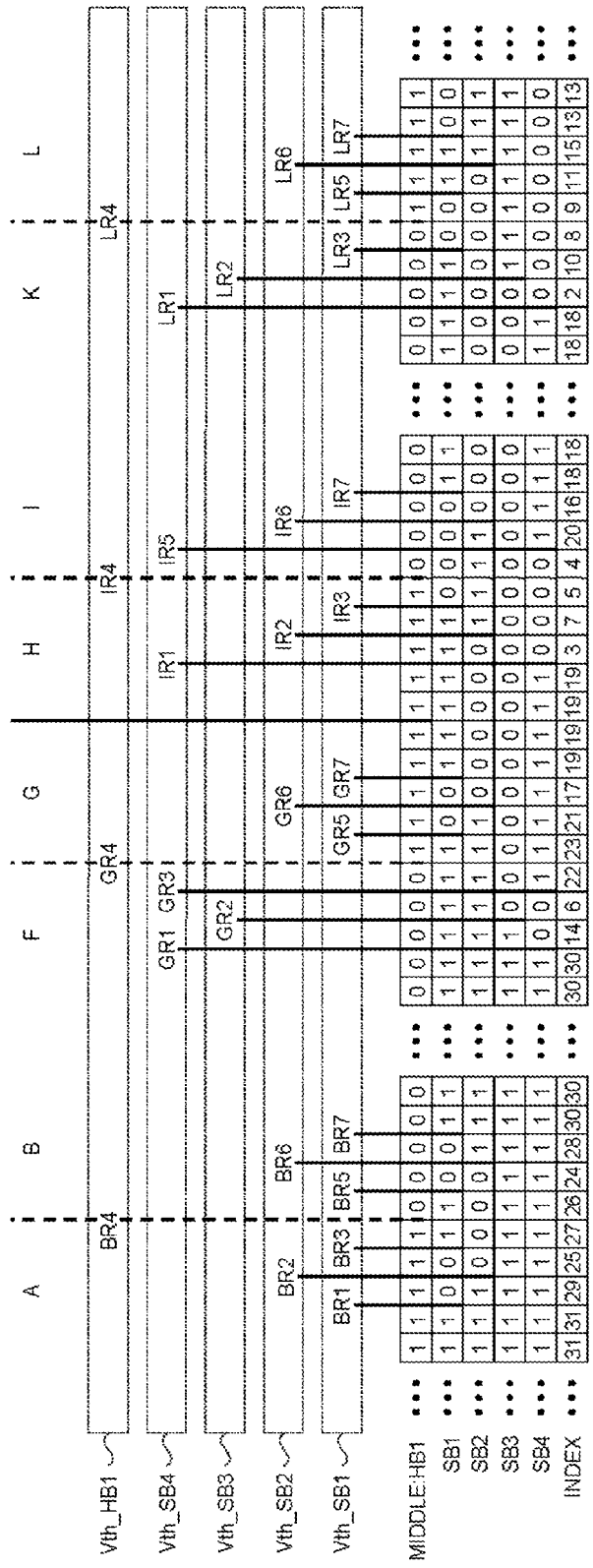
FIG. 11 is a diagram illustrating read levels used in respective acquisition sequences for a MIDDLE page according to the first embodiment.

FIG. 11 is a diagram illustrating read levels used in the respective acquisition sequences for the MIDDLE page. As illustrated in FIG. 11, boundary voltages BR1, BR3, BR5, BR7, GR5, GR7, IR3, IR7, LR3, LR5, and LR7 are used as a read level Vth_SB1 in the acquisition sequence of the SB1 information being soft bit data of the first page. Boundary voltages BR2, BR6, GR6, IR2, IR6, and LR6 are used as a read level Vth_SB2 in the acquisition sequence of the SBS2 information being soft bit data of the second page. Boundary voltages GR2 and LR2 are used as a read level Vth_SB3 in the acquisition sequence of the SB3 information being soft bit data of the third page. Boundary voltages GR1, GR3, IR1, IR5, and LR1 are used as a read level Vth_SB4 in the acquisition sequence of the SB4 information being soft bit data of the fourth page.

In the present descriptions, boundary voltages AR4, BR4, CR4, DR4, ER4, FR4, GR4, HR4, IR4, JR4, KR4, LR4, MR4, NR4, LR4, and OR4 used as a read level Vth_HB1 in the hard bit read are referred to as "HB boundary voltages" and boundary voltages AR1 to AR3, AR5 to AR7, BR1 to BR3, BR5 to BR7, CR1 to CR3, CR5 to CR7, DR1 to DR3, DR5 to DR7, ER1 to ER3, ER5 to ER7, FR1 to FR3, FR5 to FR7, GR1 to GR3, GR5 to GR7, HR1 to HR3, HR5 to HR7, IR1 to IR3, IR5 to IR7, JR1 to JR3, JR5 to JR7, KR1 to KR3, KR5 to KR7, LR1 to LR3, LR5 to LR7, MR1 to MR3, MR5 to MR7, NR1 to NR3, NR5 to NR7, OR1 to OR3, and OR5 to OR7 used as the read levels Vth_SB1 to Vth_SB4 in the soft bit read are referred to as "SB boundary voltages".

SB boundary voltages XR1 to XR3 and XR5 to XR7 (X is any of A to O) set for an HB boundary voltage XR4 are, for example, expressed as $XR1=XR4-3\Delta R$, $XR2=XR4-2\Delta R$, $XR3=XR4-\Delta R$, $XR5=XR4+\Delta R$, $XR6=XR4+2\Delta R$, and $XR7=XR4+3\Delta R$, respectively. In this case, $\Delta R$ is a step size of read levels set for each of the HB boundary voltages to acquire the SB information. In the first embodiment, when the ECC circuit 260 performs soft-decision decoding of data (a received word) read from QLCs each having four bits stored therein, the HB information and also the SB information that is read using SB boundary voltages set with the step sizes of $-3\Delta R$, $-2\Delta R$, $-\Delta R$, $+\Delta R$, $+2\Delta R$, and $+3\Delta R$ with respect to each of HB boundary voltages are used.

By thus setting the SB boundary voltages as illustrated as an example in FIG. 11 (or FIGS. 5 to 8) for each of the HB boundary voltages, the HB information and the SB information of $-3\Delta R$, $-2\Delta R$, $-\Delta R$, $+\Delta R$, $+2\Delta R$, and $+3\Delta R$ to be used in the soft-decision decoding performed by the ECC circuit 260 can be acquired by five times of reads with respect to each of the LOWER, MIDDLE, UPPER, and HIGHER pages, in other words, by reading 5-bit information (the HB information and the SB1 to SB4 information) with respect to each page.

The SB boundary voltages set for each of the HB boundary voltages do not always need to be integral multiples of $\Delta R$, or intervals between adjacent SB boundary voltages do not need to be equal. Furthermore, in the present descriptions, the numbers of the HB boundary voltages set with respect to the LOWER, MIDDLE, UPPER, and HIGHER pages are 3, 4, 4, and 4, respectively, and the number of the SB boundary voltages for each of the HB boundary voltages (XR4) set with respect to each page is 6 in total: XR1 to XR3 and XR5 to XR7. However, the present descriptions are not limited to these numbers. For example, the numbers of the HB boundary voltages set with respect to the LOWER, MIDDLE, UPPER, and HIGHER pages can be variously modified, such as 4, 3, 4, and 4, respectively. Furthermore, the number of the SB boundary voltages set on a higher side (a lower side) of each of the HB boundary voltages (XR4) can be also appropriately changed.

However, the number of pieces of the SB information required for each of the LOWER, MIDDLE, UPPER, and HIGHER pages is changed depends on the number of the HB boundary voltages set for memory cells and the number of the SB boundary voltages set for the higher side (the lower side) of each of the HB boundary voltages. For example, when the number of the HB boundary voltages set for memory cells is P and the number of the SB boundary voltages set for the higher side (the lower side) of each of the HB boundary voltages is Q, the number S of pieces of information (the HB information+the SB information) calculated using the following expression (1) is conventionally required.

$S$=(the number of bits required to represent ($P$+1) areas)+(the number of bits required to represent ($Q$+1) areas)     (1)

For example, in the case of TLCs (triple level cells), the number of bits required to represent (P+1) areas is the number of bits required to represent eight areas because P is 7, and accordingly the number is 3. In the case of QLCs, the number of bits required to represent (P+1) is the number of bits required to represent 16 areas because P is 15, and accordingly the number is 4. That is, the number of bits required to represent (P+1) areas corresponds to an exponent w in a case where $2^{w-1}<(P+1)\leq 2^w$. Similarly, for example, in a case where Q=3, the number of bits required to represent (Q+1) areas is the number of bits required to represent four areas and is 2. That is, the number of bits required to represent (Q+1) areas corresponds to an exponent z in a case where $2^{z-1}<(2\times Q+1)\leq 2^z$.

In contrast thereto, in the first embodiment, the HB information and the SB information to be used when the ECC circuit 260 performs soft-decision decoding can be acquired with the number of pieces of information (the HP information and the SB information) one smaller than the number S calculated by the expression (1) as described above.

The SB boundary voltages used as the read levels Vth_SB1 to Vth_SB4 in the soft bit read are, for example, voltage values determined based on the HB boundary voltages BR4, GR4, IR4, and LR4 used as the read level Vth_HB1 in the hard bit read, respectively. In a case where the read level Vth_HB1 in the hard bit read is adjusted to an optimum read level Vth_HB1 (in a case of the shift read), the SB boundary voltages are voltage values determined based on the adjusted optimum read level Vth_HB1. For example, in a case where the a voltage value obtained by adjusting the HB boundary voltage BR4 is the optimum read level Vth_HB1 to be used in the shift read, voltage values obtained by adjusting BR1, BR2, BR3, BR5, BR6, and BR7 with the same adjustment value as that for BR4 are used as the read levels Vth_SB1 to Vth_SB4 in the soft bit read.

The acquisition sequences of the respective pieces of SB information described in FIG. 10 are described in detail below with reference to FIGS. 12 to 25. In FIGS. 12 to 25, "" indicates inversion of a value, "|" indicates a logical disjunction (OR) operation, and "&" indicates a logical conjunction (AND) operation.

Figure 12:
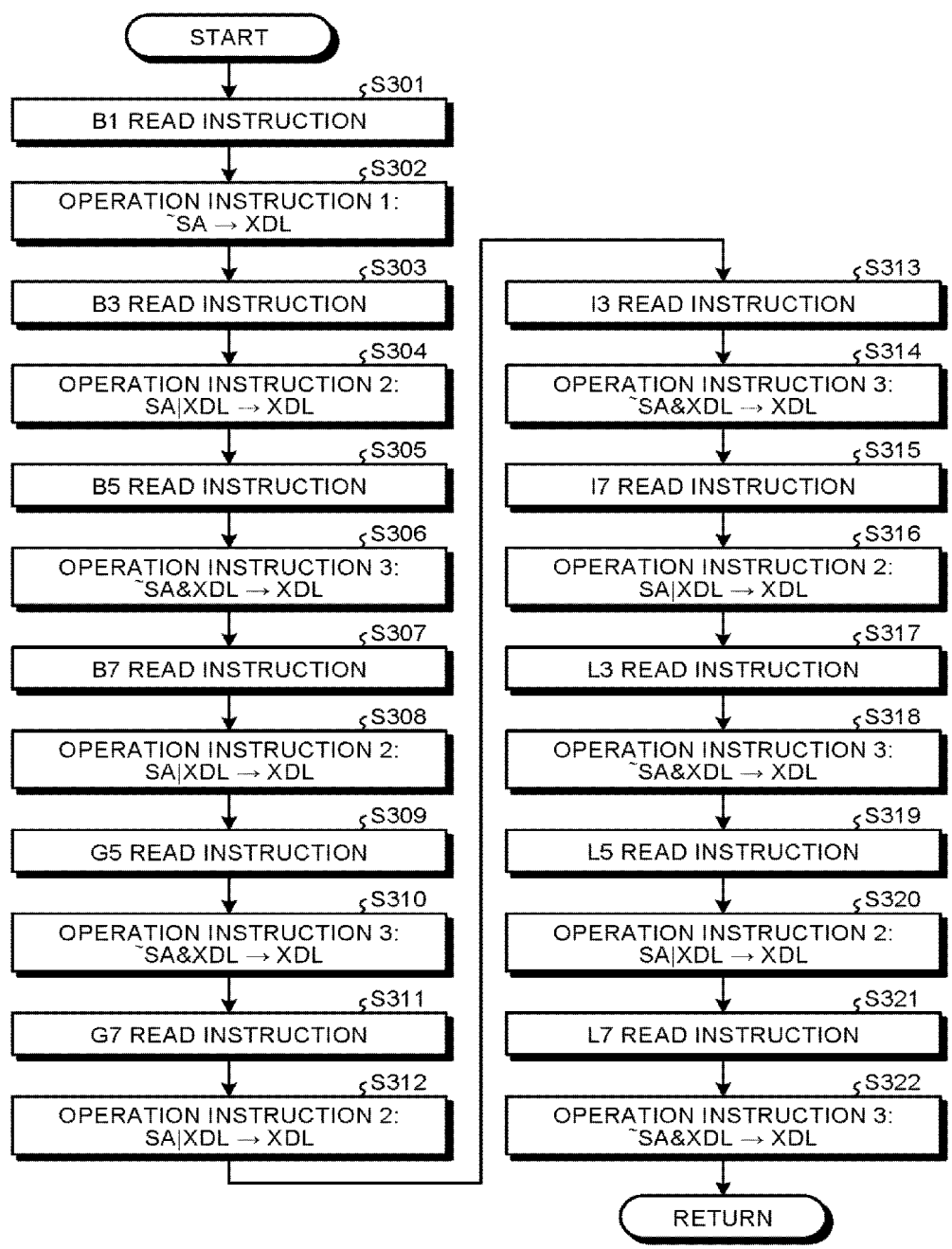
FIG. 12 is a flowchart illustrating an example of an acquisition sequence of SP1 information according to the first embodiment.

FIG. 12 is a flowchart illustrating an example of the acquisition sequence of the SB1 information at Step S203 in FIG. 10. As illustrated in FIG. 12, in the present operation, the sequencer 170 first instructs the driver circuit 130 and the row decoder 120 to perform a read (referred to as "B1 read") using BR1 as the read level Vth_SB1 (Step S301), and instructs the column module 140 to invert sense results thus detected by the sense amplifiers SA and to transfer the inverted sense results to the latch circuits XDL (Step S302). As a result, the values of the latch circuits XDL in the respective sense amplifier units SAU become inversion values of the sense results detected by the sense amplifiers SA.

Next, the sequencer 170 instructs the driver circuit 130 and the row decoder 120 to perform a read (referred to as "B3 read") using BR3 as the read level Vth_SB1 (Step S303) and instructs the column module 140 to perform a logical disjunction (OR) operation between data values thus detected by the sense amplifiers SA and the data values stored in the latch circuits XDL and to transfer resultant values to the corresponding latch circuits XDL (Step S304). As a result, the values of the latch circuits XDL in the respective sense amplifier units SAU are rewritten with the results of the logical disjunction (OR) operation.

Next, the sequencer 170 instructs the driver circuit 130 and the row decoder 120 to perform a read (referred to as "B5 read") using BR5 as the read level Vth_SB1 (Step S305) and instructs the column module 140 to perform a logical conjunction (AND) operation between inversion values of the data values thus detected by the sense amplifiers SA and the data values stored in the latch circuits XDL and to transfer resultant values to the corresponding latch circuits XDL (Step S306). As a result, the values of the latch circuits XDL in the respective sense amplifier units SAU are rewritten with the results of the logical conjunction (AND) operation.

Thereafter, also in each of reads (B7 to L7 reads) using BR7, GR5, GR7, IR3, IR7, LR3, LR5, and LR7 as the read level Vth_SB1, identical processing is performed to instruct the driver circuit 130 and the row decoder 120 to perform the read using the corresponding SB boundary voltage (Steps S307, S309, S311, S313, S315, S317, S319, and S321) and to instruct the column module 140 to perform a logical disjunction (OR) or logical conjunction (AND) operation between data values thus detected by the sense amplifiers SA or inversion values thereof and the data values stored in the latch circuits XDL and to transfer resultant values to the corresponding latch circuits XDL (Steps S308, S310, S312, S314, S316, S318, S320, and S322). As a result, the SB1 information is stored in the latch circuits XDL (the cache memory) in the respective sense amplifier units SAU. The sequencer 170 then returns to the operation illustrated in FIG. 10.

Figure 13:
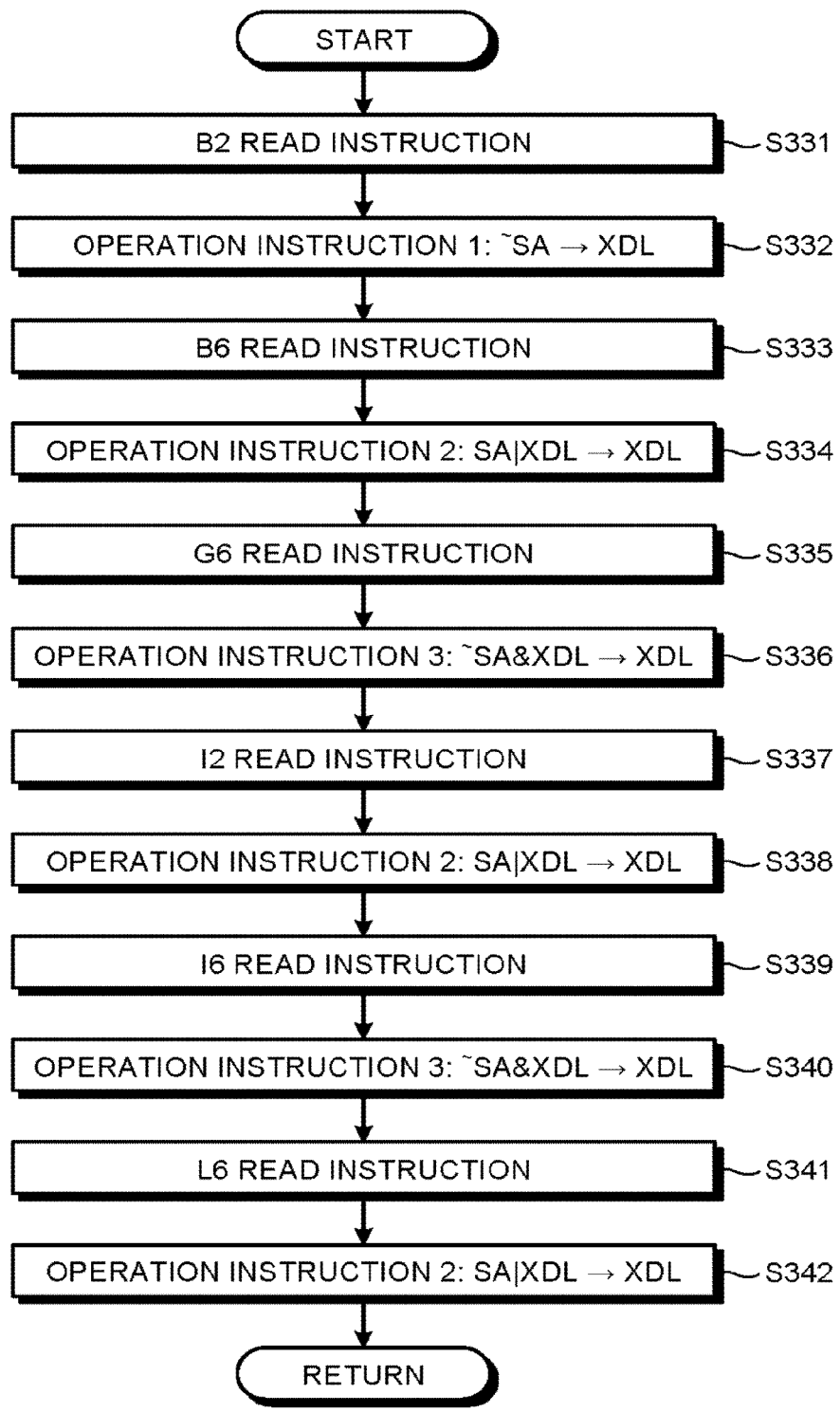
FIG. 13 is a flowchart illustrating an example of an acquisition sequence of SB2 information according to the first embodiment.

FIG. 13 is a flowchart illustrating an example of the acquisition sequence of the SB2 information at Step S205 in FIG. 10. As illustrated in FIG. 13, in the present operation, the sequencer 170 first instructs the driver circuit 130 and the row decoder 120 to perform a read (referred to as "B2 read") using BR2 as the read level Vth_SB2 (Step S331) and instructs the column module 140 to invert sense results thus detected by the sense amplifiers SA and to transfer the inverted results to the corresponding latch circuits XDL (Step S332). As a result, values of the latch circuits XDL in the respective sense amplifier units SAU become the inversion values of the sense results detected by the sense amplifier SA.

Next, the sequencer 170 instructs the driver circuit 130 and the row decoder 120 to perform a read (referred to as "B6 read") using BR6 as the read level Vth_SB2 (Step S333) and instructs the column module 140 to perform a logical disjunction (OR) operation between data values thus detected by the sense amplifiers SA and the data values stored in the latch circuits XDL and to transfer resultant values to the corresponding latch circuits XDL (Step S334). As a result, the values of the latch circuits XDL in the respective sense amplifier units SAU are rewritten with the results of the logical disjunction (OR) operation (Step S334).

Next, the sequencer 170 instructs the driver circuit 130 and the row decoder 120 to perform a read (referred to as "G6 read") using GR6 as the read level Vth_SB2 (Step S335) and instructs the column module 140 to perform a logical conjunction (AND) operation between inversion values of data values thus detected by the sense amplifiers SA and the data values stored in the latch circuits XDL and to transfer resultant values to the corresponding latch circuits XDL (Step S336). As a result, the values of the latch circuits XDL in the respective sense amplifier units SAU are rewritten with the results of the logical conjunction (AND) operation.

Thereafter, also in each of reads (I2 to L6 reads) using IR2, IR6, and LR6 as the read level Vth_SB2, the driver circuit 130 and the row decoder 120 are similarly instructed to perform a read using the corresponding SB boundary voltage (Steps S337, S339, and S341) and the column module 140 is instructed to perform a logical disjunction (OR) or logical conjunction (AND) operation between data values thus detected by the sense amplifiers SA or inversion values thereof and the data values stored in the latch circuits XDL and to transfer resultant values to the corresponding latch circuits XDL (Steps S338, S340, and S342). As a result, the SB2 information is stored in the latch circuits XDL (the cache memory) in the respective sense amplifier units SAU. The sequencer 170 then returns to the operation illustrated in FIG. 10.

FIG. 14 is a flowchart illustrating an example of the acquisition sequence of the SB3 information at Step S207 in FIG. 10. As illustrated in FIG. 14, in the present operation, the sequencer 170 first instructs the driver circuit 130 and the row decoder 120 to perform a read (referred to as "G2 read") using GR2 as the read level Vth_SB3 (Step S351) and instructs the column module 140 to invert sense results thus detected by the sense amplifiers SA and to transfer the inverted results to the corresponding latch circuits XDL (Step S352). As a result, values of the latch circuits XDL in the respective sense amplifier units SAU become inversion values of the sense results detected by the sense amplifiers SA.

Subsequently, the sequencer 170 instructs the driver circuit 130 and the row decoder 120 to perform a read (referred to as "L2 read") using LR2 as the read level Vth_SB3 (Step S353) and instructs the column module 140 to perform a logical disjunction (OR) operation between data values thus detected by the sense amplifiers SA and the data values stored in the latch circuits XDL and to transfer resultant values to the corresponding latch circuits XDL (Step S354). As a result, the values of the latch circuits XDL in the respective sense amplifier units SAU are rewritten with the results of the logical disjunction (OR) operation and the SB3 information is stored in the latch circuits XDL (the cache memory) of the respective sense amplifier units SAU. The sequencer 170 then returns to the operation illustrated in FIG. 10.

FIG. 15 is a flowchart illustrating an example of the acquisition sequence of the SB4 information at Step S209 in FIG. 10. As illustrated in FIG. 15, in the present operation, the sequencer 170 first instructs the driver circuit 130 and the row decoder 120 to perform a read (referred to as "G1 read") using GR1 as the read level Vth_SB4 (Step S361) and instructs the column module 140 to invert sense results thus detected by the sense amplifiers SA and to transfer the inverted results to the corresponding latch circuits XDL (Step S362). As a result, the values of the latch circuits XDL in the respective sense amplifier units SAU become the inversion values of the sense results detected by the sense amplifiers SA.

Next, the sequencer 170 instructs the driver circuit 130 and the row decoder 120 to perform a read (referred to as "G3 read") using GR3 as the read level Vth_SB4 (Step S363) and instructs the column module 140 to perform a logical disjunction (OR) operation between data values thus detected by the sense amplifiers SA and the data values stored in the latch circuits XDL and to transfer resultant values to the corresponding latch circuits XDL (Step S364). As a result, the values of the latch circuits XDL in the respective sense amplifier units SAU are rewritten with the results of the logical disjunction (OR) operation (Step S364).

Subsequently, the sequencer 170 instructs the driver circuit 130 and the row decoder 120 to perform a read (referred to as "I1 read") using IR1 as the read level Vth_SB4 (Step S365) and instructs the column module 140 to perform a logical conjunction (AND) operation between inversion values of data values thus detected by the sense amplifiers SA and the data values stored in the latch circuits XDL and to transfer resultant values to the corresponding latch circuits XDL (Step S366). As a result, the values of the latch circuits XDL in the respective sense amplifier units SAU are rewritten with the results of the logical conjunction (AND) operation.

Thereafter, also in each of reads (I5 and L1 reads) using IR5 and LR1 as the read level Vth_SB4, the driver circuit 130 and the row decoder 120 are similarly instructed to perform a read using the corresponding SB boundary voltage (Steps S367 and S369) and the column module 140 is instructed to perform a logical disjunction (OR) or logical conjunction (AND) operation between data values thus detected by the sense amplifiers SA or inversion values thereof and the data values stored in the latch circuits XDL and to transfer resultant values to the corresponding latch circuits XDL (Steps S368 and S370). As a result, the SB4 information is stored in the latch circuits XDL (the cache memory) in the respective sense amplifier units SAU. The sequencer 170 then returns to the operation illustrated in FIG. 10.

As described above, the acquisition sequence of each piece of SB information is constituted of repetitions of single level reads and data latch operations. This is described more specifically using the acquisition sequence of the SB4 information illustrated in FIG. 15 as an example. FIGS. 16 to 25 are explanatory diagrams of the acquisition sequence of the SB4 information illustrated in FIG. 15 in more detail. Among FIGS. 16 to 25, FIGS. 16, 18, 20, 22, and 24 are waveform charts of voltage waveforms used in respective single level reads. FIGS. 17, 19, 21, 23, and 25 are explanatory diagrams of data latch operations performed after the respective single level reads.

As illustrated in FIG. 16, in the G1 read at Step S361 in FIG. 15, the row decoder 120 applies the read level GR1 to a word line (hereinafter, "selective word line") of a page that is a read target and applies a voltage VREAD to word lines (hereinafter, "non-selective word line") of pages that are not the read target at the timing of a time t0. The voltage VREAD is a voltage that brings memory cells connected to the non-selective word lines to an on-state regardless of retained data. At the same timing of the time t0, the row decoder 120 applies a voltage to the select gate lines SGD and SGS to turn the selective transistors ST1 and ST2 on. Next, at the timing of a time t1, the sense amplifier units SAU start precharging bit lines to which read target memory cells are connected. Subsequently, the sense amplifier units SAU sense whether the memory cells located at intersections between the precharged bit lines and the selective word line are in an on-state. Specifically, the sequencer 170 sets the signal STB to an "H" level at the timing of a time t2. In this way, sense results of the target memory cells are acquired by the sense amplifiers SA.

When the G1 read illustrated in FIG. 16 is performed, data values of the latch circuits XDL are updated from those illustrated in FIG. 17(a) to those illustrated in FIG. 17(b). Specifically, when the G1 read is performed (Step S361 in FIG. 15), a bit at a threshold voltage level lower than GR1 (hereinafter, "bit at a higher order than GR1") is discharged to be "0" while bits at threshold voltage levels higher than GR1 (hereinafter, "bits at lower orders than GR1") are not discharged and maintain "1", as illustrated in FIG. 17(a). As a result, sense results detected by the sense amplifiers SA in the G1 read become "011111". The sense results "011111" are inverted to "100000" and the inversion values "100000" are transferred to the latch circuits XDL (Step S362 in FIG.

15). As a result, the data values stored in the latch circuits XDL become "100000" as illustrated in FIG. 17(b).

Next, in the G3 read at Step S363 in FIG. 15, the row decoder 120 applies the read level GR3 to the selective word line and also applies the voltage VREAD to the non-selective word lines at the timing of a time t3 as illustrated in FIG. 18. The row decoder 120 turns on the selective transistors ST1 and ST2 at the same timing of the time t3. Subsequently, the sense amplifier units SAU start precharging the target bit lines at the timing of a time t4 and then the sequencer 170 sets the signal STB to the "H" level at the timing of a time t5. Accordingly, sense results of the target memory cells are acquired by the sense amplifiers SA.

When the operation (Step S364 in FIG. 15) using the sense results acquired in the G3 read illustrated in FIG. 18 is performed, the data values of the latch circuits XDL are updated from those illustrated in FIG. 19(a) (same as the data values illustrated in FIG. 17(b)) to those illustrated in FIG. 19(b). Specifically, when the G3 read is performed (Step S363 in FIG. 15), sense results "001111" are acquired in which bits at higher orders than GR3 have become "0" as illustrated in FIG. 19(a). At Step S364 in FIG. 15, a logical disjunction (OR) operation between the sense results "001111" and the data values "100000" stored in the latch circuits XDL is performed. Results "101111" of the logical disjunction (OR) operation are transferred to the latch circuits XDL. As a result, the data values stored in the latch circuits XDL are rewritten with "101111" as illustrated in FIG. 19(b).

Figure 20:
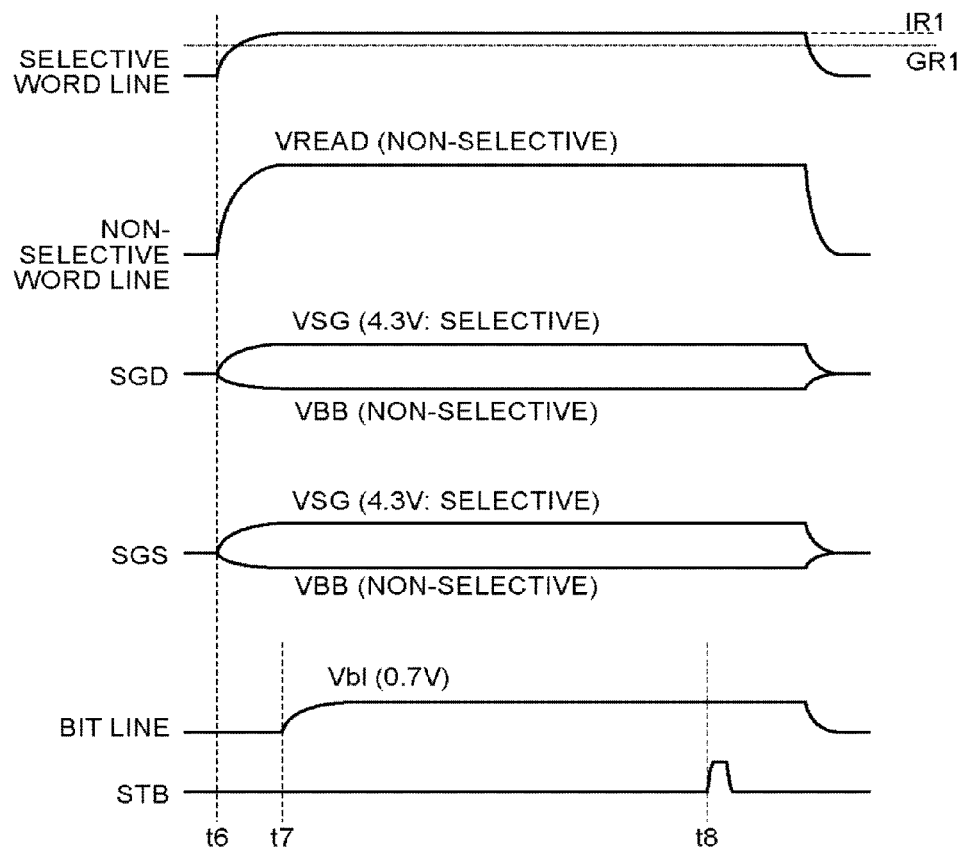
FIG. 20 is a waveform chart of voltage waveforms used in the next single level read in the acquisition sequence of the SB4 information illustrated in FIG. 15.
Figure 21:
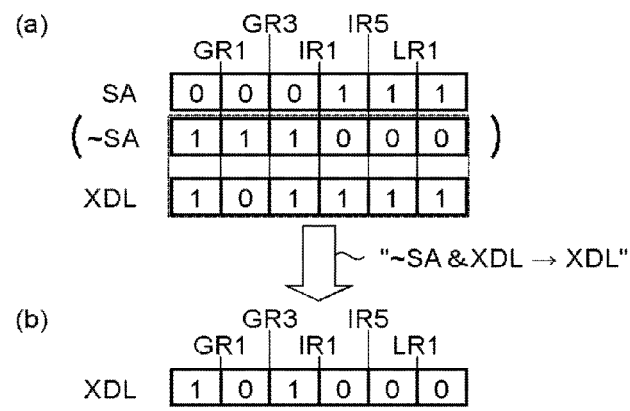
FIG. 21 is an explanatory diagram of data latch operations performed after a single level read using voltage waveforms illustrated in FIG. 20.

Next, in the I1 read at Step S365 in FIG. 15, the row decoder 120 applies the read level IR1 to the selective word line and also applies the voltage VREAD to the non-selective word lines at the timing of a time t6 as illustrated in FIG. 20. The row decoder 120 turns on the selective transistors ST1 and ST2 at the same timing of the time t6. Subsequently, the sense amplifier units SAU start precharging the target bit lines at the timing of a time t7 and then the sequencer 170 sets the signal STB to the "H" level at the timing of a time t8. In this way, sense results of the target memory cells are acquired by the sense amplifiers SA.

When the operation (Step S366 in FIG. 15) using the sense results acquired in the I1 read illustrated in FIG. 20 is performed, the data values of the latch circuits XDL are updated from those illustrated in FIG. 21(a) (same as the data values illustrated in FIG. 19(b)) to those illustrated in FIG. 21(b). Specifically, when the I1 read is performed (Step 3365 in FIG. 15), sense results "000111" are acquired in which bits at higher orders than IR1 have become "0" as illustrated in FIG. 21(a). At Step S366 in FIG. 15, a logical conjunction (AND) operation between inversion values "111000" obtained by inverting the sense results "000111" and the data values "101111" stored in the latch circuits XDL is performed. Results "101000" of the logical conjunction (AND) operation are transferred to the latch circuits XDL. As a result, the data values stored in the latch circuits XDL are rewritten with "101000" as illustrated in FIG. 21(b).

Figure 22:
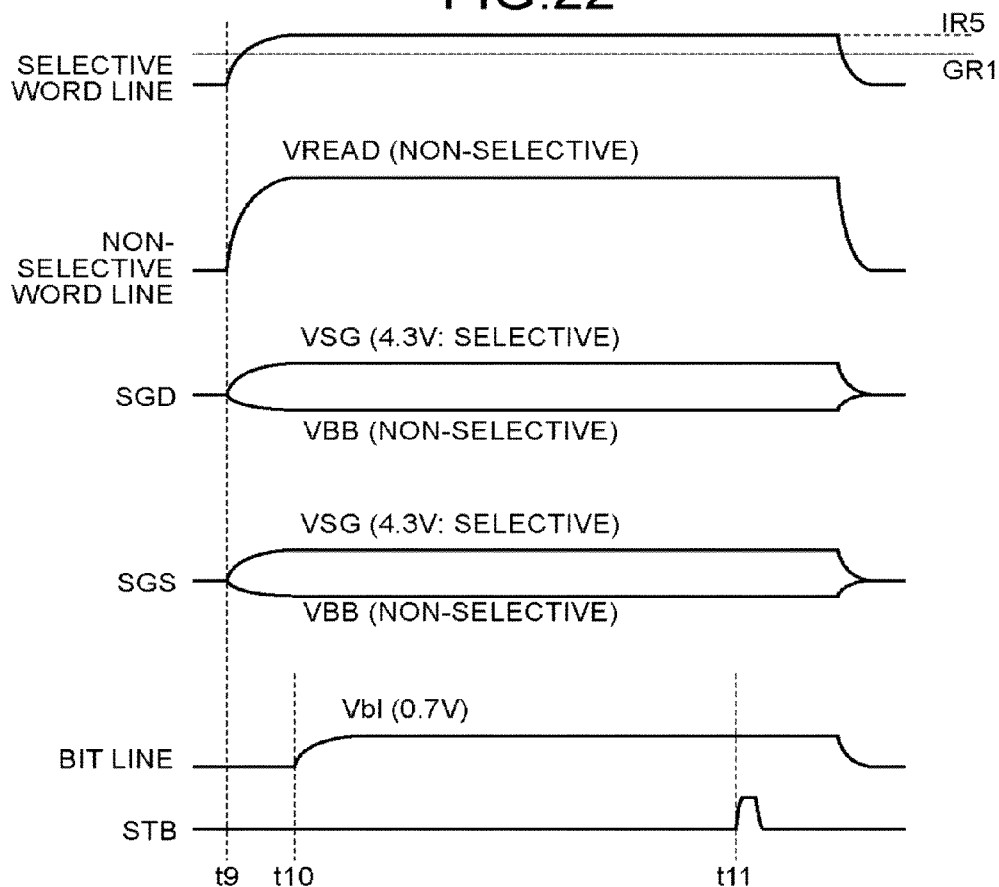
FIG. 22 is a waveform chart of voltage waveforms used in the next single level read in the acquisition sequence of the SB4 information illustrated in FIG. 15.
Figure 23:
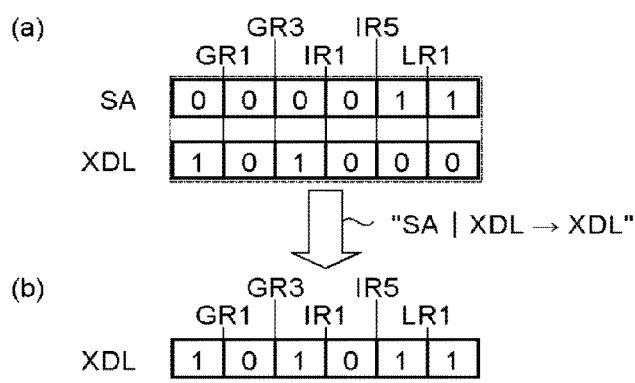
FIG. 23 is an explanatory diagram of data latch operations performed after a single level read using voltage waveforms illustrated in FIG. 22.

Next, in the I5 read at Step S367 in FIG. 15, the row decoder 120 applies the read level IR5 to the selective word line and also applies the voltage VREAD to the non-selective word lines at the timing of a time t9 as illustrated in FIG. 22. The row decoder 120 turns on the selective transistors ST1 and ST2 at the same timing of the time t9. Next, the sense amplifier units SAU start precharging the target bit lines at the timing of a time t10 and then the sequencer 170 sets the signal STB to the "H" level as the timing of a time t11. In this way, the sense amplifiers SA acquire sense results of the target memory cells.

When the operation (Step S368 in FIG. 15) using the sense results acquired in the I5 read illustrated in FIG. 22 is performed, the data values of the latch circuits XDL are updated from those illustrated in FIG. 23(a) (same as the data values illustrated in FIG. 21(b)) to those illustrated in FIG. 23(b). Specifically, when the I5 read is performed (Step S367 in FIG. 15), sense results "000011" in which bits at higher orders than IR5 have become "0" are acquired as illustrated in FIG. 23(a). At Step S368 in FIG. 15, a logical disjunction (OR) operation between the sense results "000011" and the data "101000" stored in the latch circuits XDL is performed. Results "101011" of the logical disjunction (OR) operation are transferred to the latch circuits XDL. As a result, the data values stored in the latch circuits XDL are rewritten with "101011" as illustrated in FIG. 23(b).

Figure 24:
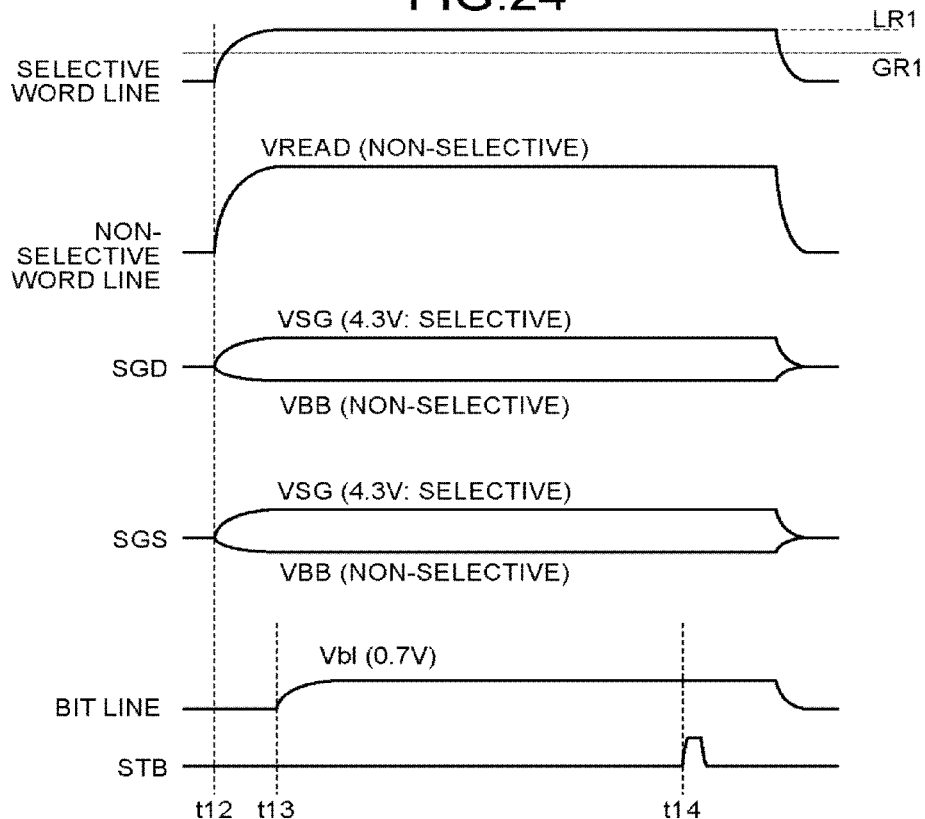
FIG. 24 is a waveform chart of voltage waveforms used in the next single level read in the acquisition sequence of the SB4 information illustrated in FIG. 15.
Figure 25:
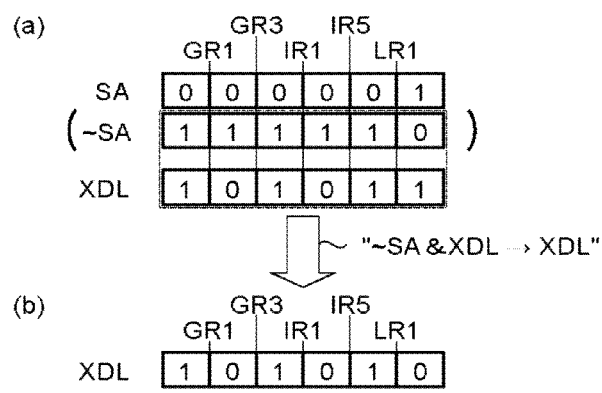
FIG. 25 is an explanatory diagram of data latch operations performed after a single level read using voltage waveforms illustrated in FIG. 24.

Next, in the L1 read at Step S369 in FIG. 15, the row decoder 120 applies the read level LR1 to the selective word line and also applies the voltage VREAD to the non-selective word lines at the timing of a time t12 as illustrated in FIG. 24. The row decoder 120 turns on the selective transistors ST1 and ST2 at the same timing of the time t12. Next, the sense amplifier units SAU start precharging the target bit lines at the timing of a time t13 and then the sequencer 170 sets the signal STB to the "H" level at the timing of a time t14. In this way, the sense amplifiers SA acquire sense results of the target memory cells.

When the operation (Step S370 in FIG. 15) using the sense results acquired by the L1 read illustrated in FIG. 24 is performed, the data values of the latch circuits XDL are updated from those illustrated in FIG. 25(a) (same as the data values illustrated in FIG. 23(a)) to those illustrated in FIG. 25(b). Specifically, when the L1 read is performed (Step S369 in FIG. 15), sense results "000001" in which bits at higher orders than LR1 have become "0" are acquired as illustrated in FIG. 25(a). At Step S370 in FIG. 15, a logical conjunction (AND) operation between inversion values "111110" obtained by inverting the sense results "000001" and the data "101011" stored in the latch circuits XDL is performed. Results "101010" of the logical conjunction (AND) operation are transferred to the latch circuits XDL. As a result, the data values stored in the latch circuits XDL are rewritten with "101010" as illustrated in FIG. 25(b).

The above operation is performed also on the LOWER page, the UPPER page, and the HIGHER page as well as the MIDDLE page, so that data of a total of five pages including the HB information, the SB1 information, the SB2 information, the SB3 information, and the SB4 information can be acquired for each of the pages.

The data of five pages acquired for each of the LOWER, MIDDLE, UPPER, and HIGHER pages is input to the ECC circuit 260. The ECC circuit 260 performs soft-decision decoding using an error-correcting code such as an LDPC (low-density parity-check code). The SB1 information to the SB4 information read in the first embodiment includes SB information of −3ΔR, −2ΔR, −ΔR, +ΔR, +2ΔR, and +3ΔR for each of the HB boundary voltages (AR to OR) required for the soft-decision decoding. Accordingly, the ECC circuit 260 can perform the soft-decision decoding using the data of five pages acquired by the five times of reads (four times of reads in a case where Steps S201 and S202 in FIG. 10 can be omitted) with respect to each of the LOWER, MIDDLE, UPPER, and HIGHER pages. That is, in a case where 4-bit data is programmed in one memory cell, data of a total of six bits including the HB information conventionally needs to be acquired from the memory cell with respect to each of the LOWER, MIDDLE, UPPER, and HIGHER pages, while information required for soft-decision decoding performed by the ECC circuit 260 can be acquired by acquiring data of a total of five bits including the HB information from one memory cell (QLC) with respect to each of the LOWER, MIDDLE, UPPER, and HIGHER pages in the first embodiment. This can reduce the times of reads and the transfer amount of read data. Therefore, a data read from the NAND memory 100 can be achieved more rapidly.

Second Embodiment

A memory system according to a second embodiment and a method of controlling the memory system are described in detail next with reference to the drawings. In the following descriptions, constituent elements identical to those in the first embodiment described above are denoted by like reference signs, and redundant descriptions thereof will be omitted.

The first embodiment described above includes a configuration in which each of steps in the acquisition sequence of each piece of the SB information is performed, for example, in response to a read instruction using a corresponding boundary voltage and an operation instruction sequentially input from the sequencer 170 to the driver circuit 130, the row decoder 120, and the column module 140 as described with reference to FIGS. 12 to 15, for example. In the present descriptions, this procedure of sequentially performing reads and operations in response to instructions from the sequencer 170 is referred to as "manual read". In contrast to the manual read, in the second embodiment, a configuration in which reads and operations for acquiring the HB information through the SB4 information are performed in response to one instruction issued by the sequencer 170 based on the SB read instruction issued at Step S129 in FIG. 9, for example, is described in detail below with reference to the drawings. In the following descriptions, a soft bit read of acquiring the HB information through the SB4 information based on one instruction issued by the sequencer 170 is referred to as "concatenated soft bit read".

The memory system according to the second embodiment can have an identical configuration to that of the memory system 1 illustrated as an example in the first embodiment.

Figure 26:
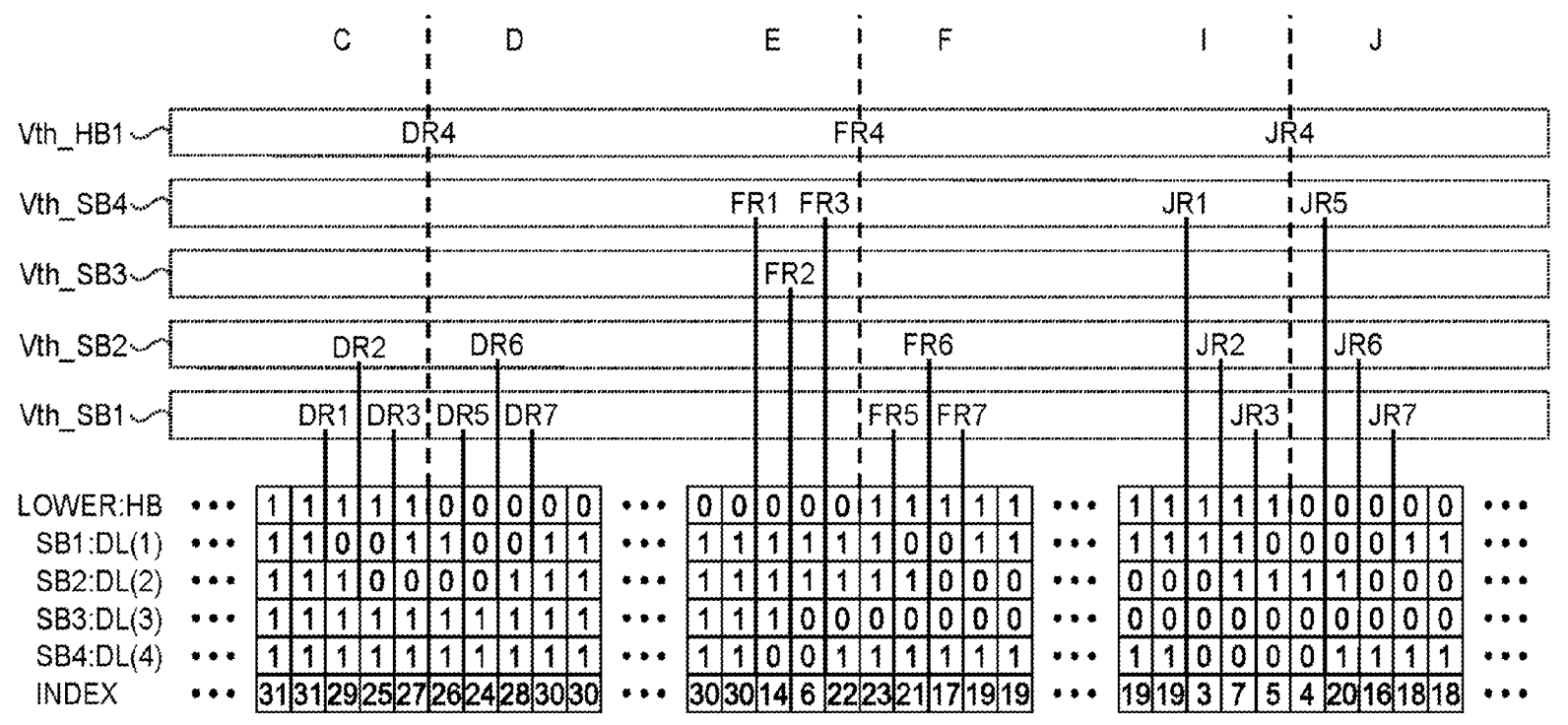
Figure 27:
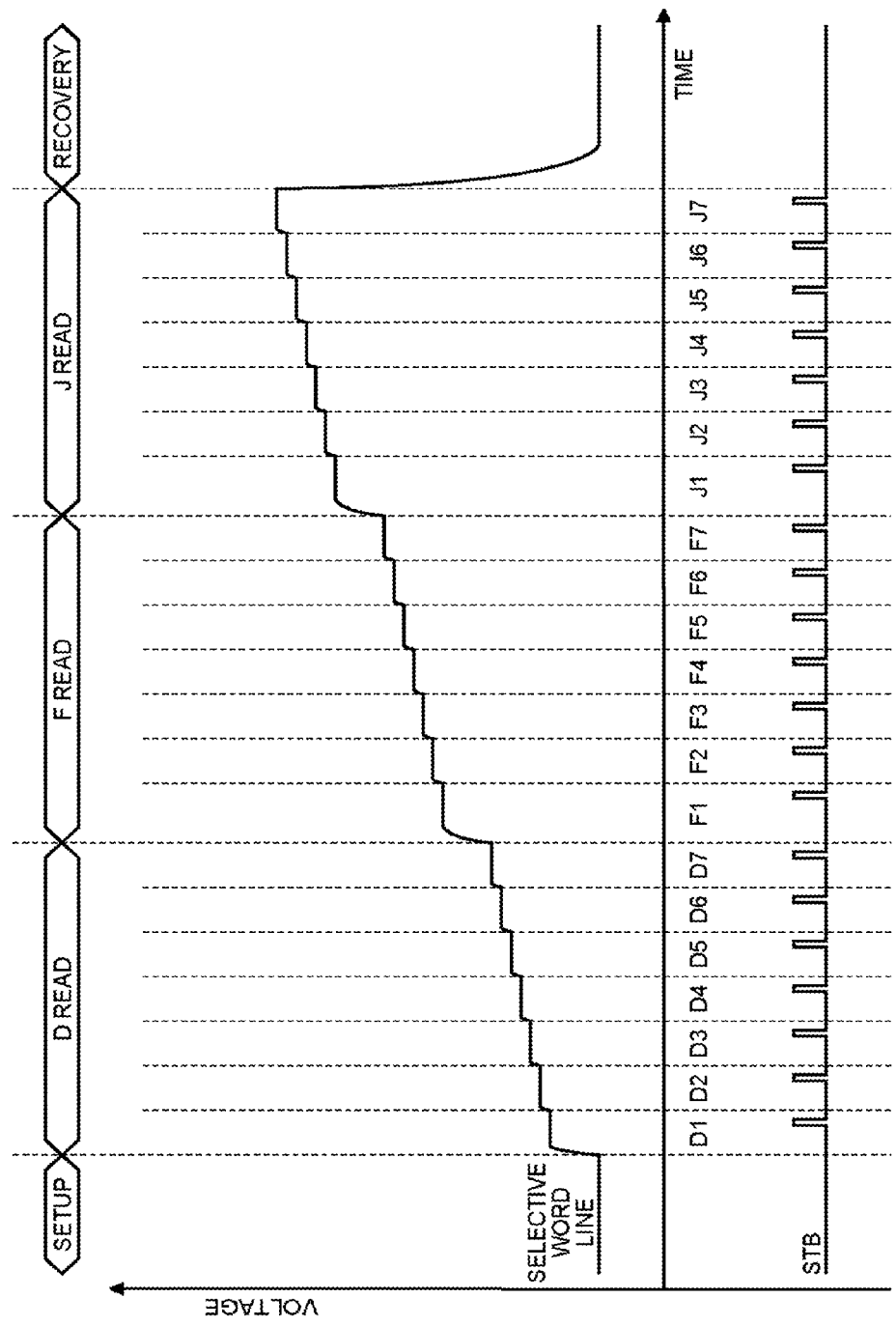
FIG. 27 is a waveform chart of read levels applied to a selective word line to acquire HB information through the SB4 information of the LOWER page based on one instruction according to the second embodiment.

FIG. 26 is a diagram illustrating read levels used in the concatenated soft bit read for a LOWER page. FIG. 27 is a waveform chart of read levels applied to a selective word line to acquire the HB information through the SB4 information of the LOWER page based on one instruction.

As illustrated in FIG. 26, when the HB information through the SB4 information are to be acquired based on one instruction, three HB boundary voltages, for example, DR4, FR4, and JR4 are used as the read level Vth_HB1 to acquire the HB information of the LOWER page. The SB boundary voltages DR1, DR3, DR5, DR7, FR5, FR7, JR3, and JR7 are used as the read level Vth_SB1 to acquire the SB1 information being soft bit data of a first page of the LOWER page. The SB boundary voltages DR2, DR6, FR6, JR2, and JR6 are used as the read level Vth_SB2 to acquire the SB2 information being soft bit data of a second page of the LOWER page, the SB boundary voltage FR2 is used as the read level Vth_SB3 to acquire the SB3 information being soft bit data of a third page thereof, and the SB boundary voltages FR1, FR3, JR1, and JR5 are used as the read level Vth_SB4 in the acquisition sequence of the SB4 information being data values of a fourth page thereof.

The voltage values of the respective boundary voltages DR1 to DR7, FR1 to FR7, and JR1 to JR7 illustrated in FIG. 26 become higher toward the right side in the drawing. Accordingly, when the HB information through the SB4 information are to be acquired based on one instruction as illustrated in FIG. 27, the read level Vth is switched to transition, for example, from a lower voltage to a higher voltage in a stepwise manner, that is, from DR1 to JR7 in this order. The signal STB is set to the "H" level at a timing when the read level Vth is stabled at each of the boundary voltages DR1 to JR7 to detect an on/off-state of the memory cells with the corresponding boundary value. In this way, sense results (bit values) at each of the read levels Vth of DR1 to JR7 can be acquired. Because a waveform of a voltage (VREAD) of non-selective word lines, waveforms of voltages of the select gate lines SGD and SGS, and a waveform of a voltage for precharging bit lines to which read target memory cells are connected are identical to those illustrated as an example in FIG. 16, detailed descriptions thereof are omitted here and in FIG. 27.

Figure 28:
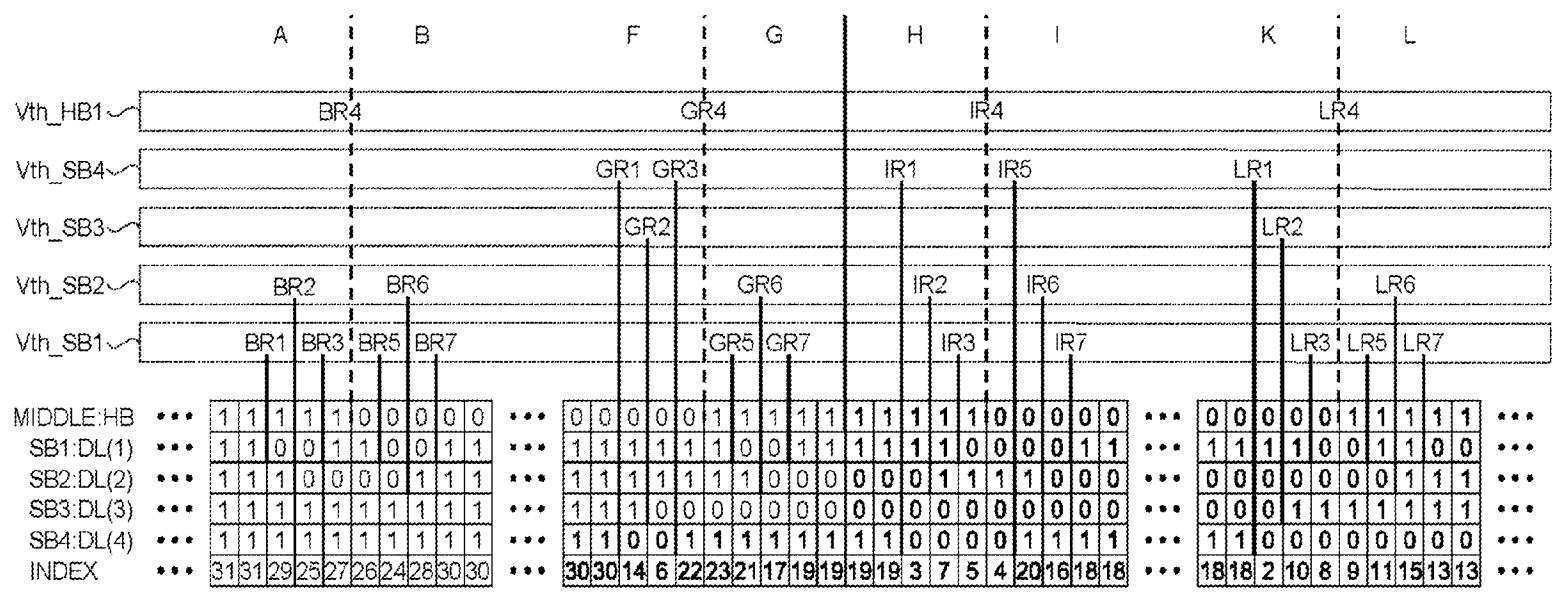
Figure 29:
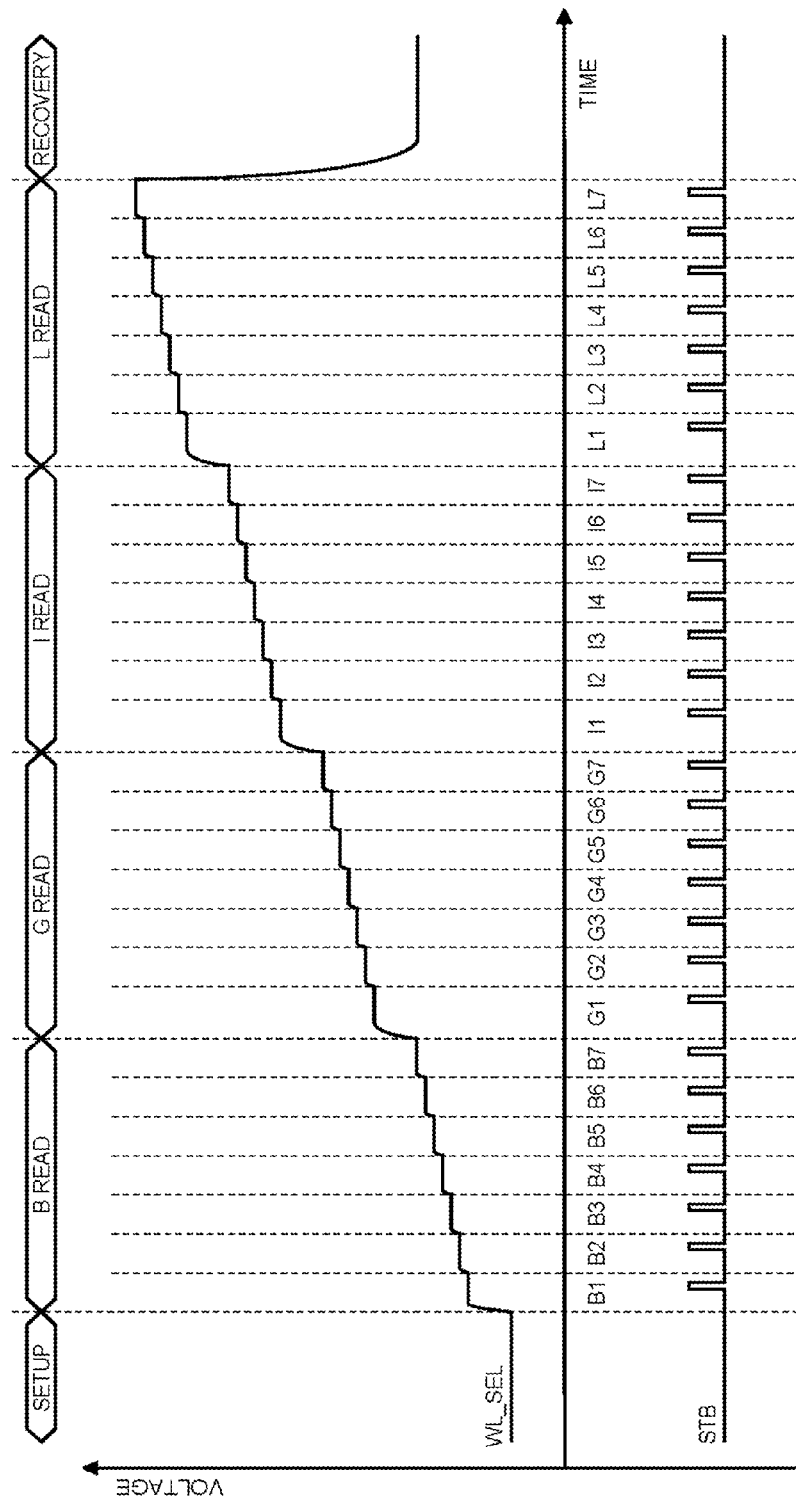
FIG. 29 is a waveform chart of read levels applied to a selective word line when the HB information through the SB4 information of the MIDDLE page are acquired based on one instruction according to the second embodiment.

FIG. 28 is a diagram illustrating read levels used in the concatenated soft bit read for a MIDDLE page. FIG. 29 is a waveform chart of read levels applied to a selective word line when the HB information through the SB4 information of the MIDDLE page are acquired based on one instruction.

As illustrated in FIG. 28, when the HB information through the SB4 information are to be acquired based on one instruction, four HB boundary voltages, for example, BR4, GR4, IR4, and LR4 are used as the read level Vth_HB1 to acquire the HB information of the MIDDLE page. The SB boundary voltages BR1, BR3, BR5, BR7, GR5, GR7, IR3, IR7, LR3, LR5, and LR7 are used as the read level Vth_SB1 to acquire the SB1 information being soft bit data of a first page of the MIDDLE page, the SB boundary voltages BR2, BR6, GR6, IR2, IR6, and LR6 are used as the read level Vth_SB2 to acquire the SB2 information being soft bit data of a second page thereof, the SB boundary voltages GR2 and LR2 are used as the read level Vth_SB3 to acquire the SB3 information being soft bit data of a third page thereof, and the SB boundary voltages GR1, GR3, IR1, IR5, and LR1 are used as the read level Vth_SB4 in the acquisition sequence of the SB4 information being data values of a fourth page thereof.

The voltage values of the respective boundary voltages BR1 to BR7, GR1 to GR7, IR1 to IR7, and LR1 to LR7 illustrated in FIG. 28 also become higher toward the right side in the drawing similarly to those in FIG. 26. Accordingly, when the HB information through the SB4 information are to be acquired based on one instruction, the read level Vth is switched to transition, for example, from a lower voltage to a higher voltage in a stepwise manner, that is, from BR1 to LR7 in this order as illustrated in FIG. 29. The signal STB is set to the "H" level to detect an on/off-state of the memory cells with each of the boundary voltages BR1 to LR7 at a timing when the read level Vth is stabilized at the corresponding boundary voltage similarly to that in FIG. 27. In this way, sense results (bit values) at each of the read levels Vth of BR1 to LR7 can be acquired. Because a waveform of a voltage (VREAD) of non-selective word lines, waveforms of voltages of the select gate lines SGD and SGS, and a waveform of a voltage for precharging bit lines to which the read target memory cells are connected have identical waveforms to those illustrated as an example in FIG. 16, detailed descriptions thereof are omitted here and in FIG. 29.

Also as for each of remaining UPPER and HIGHER pages, the read level Vth for reading respective pieces of the HB information through the SB4 information is similarly switched to transition, for example, from a lower voltage to a higher voltage in a stepwise manner (see FIGS. 7 and 8, for example), and the signal STB is set to the "H" level at a timing when the read level Vth is stabilized at the corresponding boundary voltage. In this way, sense results (bit values) of the HB information through the SB4 information related to each of the pages can be acquired successively based on one instruction.

Figure 30:
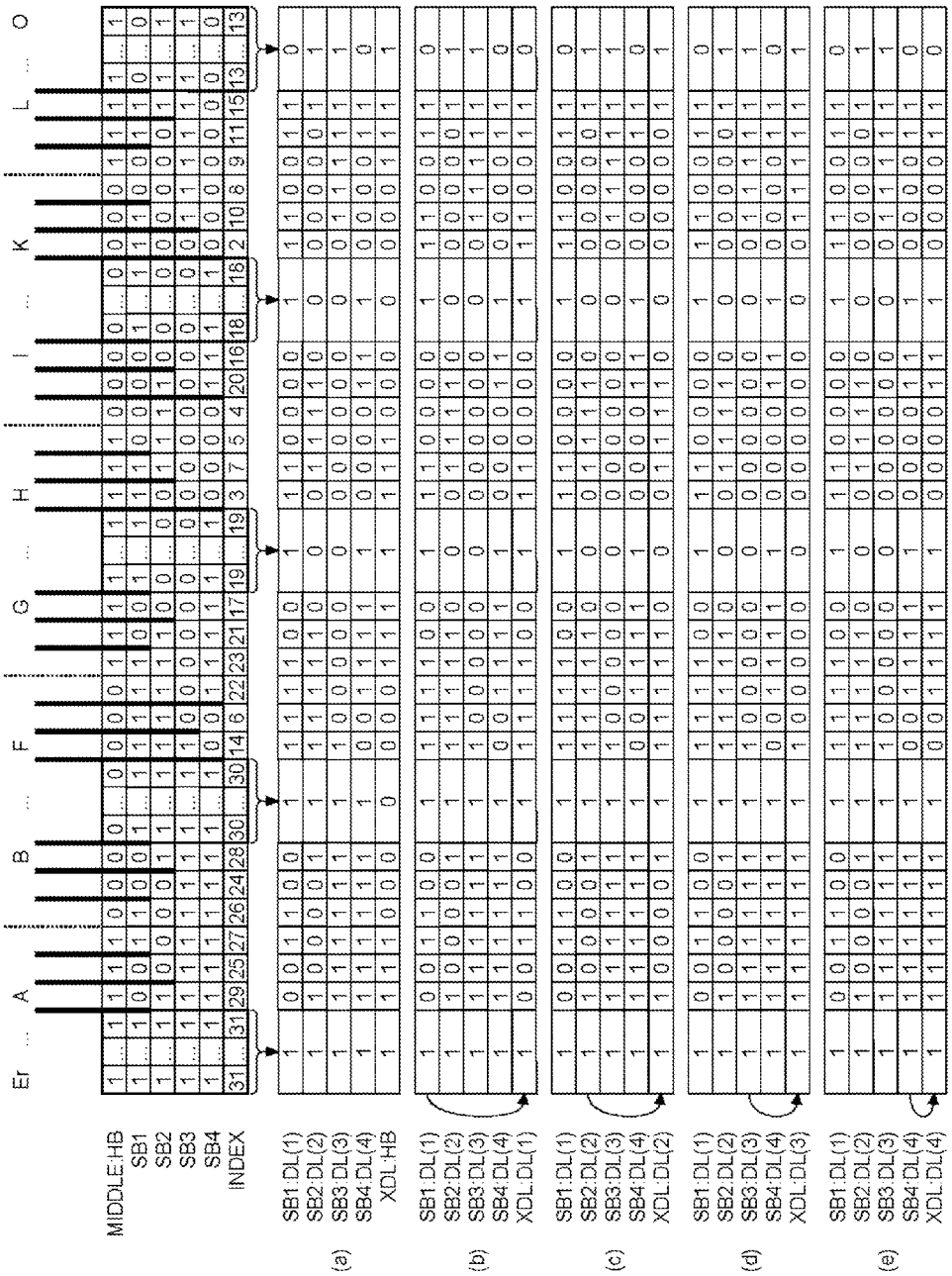
FIG. 30 illustrate a relation between the HB information through the SB4 information which are successively read and respective latch circuits in the second embodiment.

The bit values successively read using the read level Vth with the waveform as illustrated in FIG. 27 or 29 are latched for each of the pages and are stored in the latch circuits DL(1) to DL(4) and XDL. A relation between the HB information through the SB4 information successively read and the latch circuits DL(1) to DL(4) and XDL is illustrated in FIG. 30. FIG. 30 illustrate a relation in a case where the MIDDLE page is read.

As illustrated in FIG. 30(a), at a stage where the HB information through the SB4 information are successively read based on one instruction, the HB information read using the HB boundary voltages BR4, GR4, IR4, and LR4 is stored in the latch circuits XDL, the SB1 information read using the SB boundary voltages BR1, BR3, BR5, BR7, GR5, GR7, IR3, IR7, LR3, LR5, and JR7 is stored in the latch circuits DL(1), the SB2 information read using the SB boundary voltages BR2, BR6, GR6, IR2, IR6, and LR6 is stored in the latch circuits DL(2), the SB3 information read using the SB boundary voltages GR2 and LR2 is stored in the latch circuits DL(3), and the SB4 information read using the SB boundary voltages GR1, GR3, IR1, IR5, and LR1 is stored in the latch circuits DL(4).

In this state, when the HB information is retrieved by the CPU 230 from the latch circuits XDL illustrated in FIG. 30(a), the sequencer 170 issues a command to transfer the SB1 information stored in the latch circuits DL(1) to the latch circuits XDL. Accordingly, the SB1 information is stored in the latch circuits XDL as illustrated in FIG. 30(b). When the CPU 230 retrieves the SB1 information from the latch circuits XDL, the SB2 information stored in the latch circuits DL(2) is transferred to the latch circuits XDL as illustrated in FIG. 30(c). When the CPU 230 retrieves the SB2 information from the latch circuits XDL, the SB3 information stored in the latch circuits DL(3) is transferred to the latch circuits XDL as illustrated in FIG. 30(d). When the CPU 230 retrieves the SB3 information from the latch circuits XDL, the SB4 information stored in the latch circuits DL(4) is transferred to the latch circuits XDL as illustrated in FIG. 30(e). Finally, the SB4 information is retrieved from the latch circuits XDL by the CPU 230.

Figure 31:
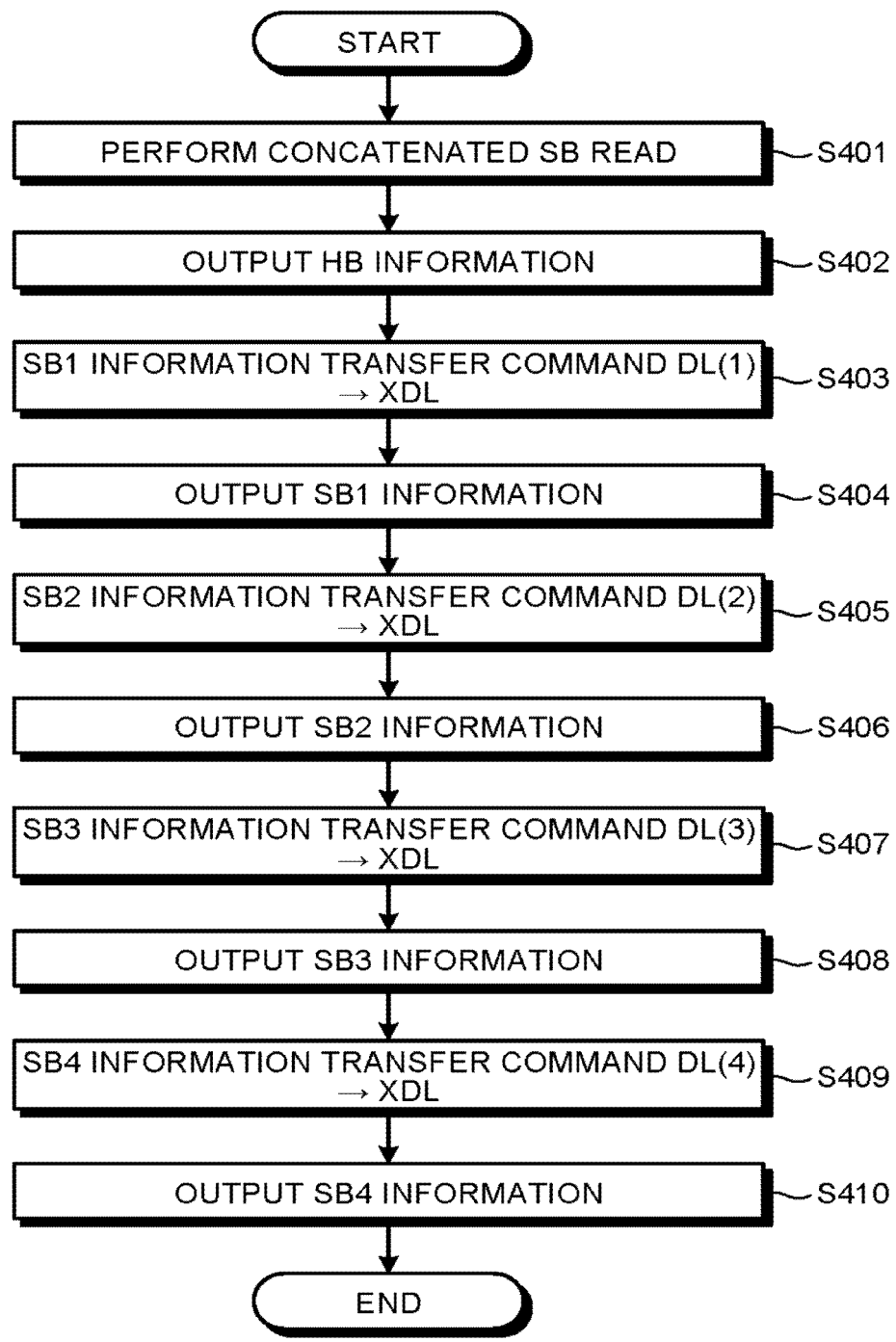
FIG. 31 is a flowchart illustrating an example of a main flow of a soft bit read according to the second embodiment.

A detailed operation example of the concatenated soft bit read according to the second embodiment is described in detail below with reference to the drawings. FIG. 31 is a flowchart illustrating an example of a main flow of the concatenated soft bit read according to the second embodiment. The operation illustrated in FIG. 31 is performed once for each of the LOWER page, the MIDDLE page, the UPPER page, and the HIGHER page illustrated in FIGS. 5 to 8 similarly to the operation described in the first embodiment with reference to FIG. 10.

As illustrated in FIG. 31, the sequencer 170 of the NAND memory 100 having received a concatenated SB read instruction from the CPU 230 performs the concatenated soft bit read using the read level with a waveform (see FIG. 27 or 29, for example) set for a read target page among the LOWER page, the MIDDLE page, the UPPER page, and the HIGHER page (Step S401). Accordingly, the HB information is stored in the latch circuits XDL, the SB1 information is stored in the latch circuits DL(1), the SB2 information is stored in the latch circuits DL(2), the SB3 information is stored in the latch circuits DL(3), and the SB4 information is stored in the latch circuits DL(4). The sequencer 170 then outputs first the HB information stored in the latch circuits XDL to the CPU 230 (Step S402).

Next, the sequencer 170 issues a command to transfer the SB1 information stored in the latch circuits DL(1) to the latch circuits XDL (Step S403). Accordingly, the SB1 information stored in the latch circuits DL(1) is transferred to the latch circuits XDL. The sequencer 170 then outputs the SB1 information stored in the latch circuits XDL to the CPU 230 (Step S404).

Subsequently, the sequencer 170 issues a command to transfer the SB2 information stored in the latch circuits DL(2) to the latch circuits XDL (Step S405). When the SB2 information stored in the latch circuits DL(2) is thus transferred to the latch circuits XDL, the sequencer 170 outputs the SB2 information stored in the latch circuits XDL to the CPU 230 (Step S406). Thereafter, in the same manner as described above, the sequencer 170 outputs a command to transfer the SB3 information stored in the latch circuits DL(3) to the latch circuits XDL (Step S407) and, upon transfer of the SB3 information to the latch circuits XDL, outputs the SB3 information stored in the latch circuits XDL to the CPU 230 (Step S408). Subsequently, the sequencer 170 outputs a command to transfer the SB4 information stored in the latch circuits DL(4) to the latch circuits XDL (Step S409) and, upon transfer of the SB4 information to the latch circuits XDL, outputs the SB4 information stored in the latch circuits XDL to the CPU 230 (Step S410).

This configuration in which data values of the HB information through the SB4 information are acquired based on one instruction with respect to each of the LOWER page, the MIDDLE page, the UPPER page, and the HIGHER page simplifies control during reads, and also enables the reads in a shorter time.

Because other configurations, operations and effects are identical to those in the embodiments described above, detailed descriptions thereof will be omitted here.

Third Embodiment

A memory system according to a third embodiment and a method of controlling the memory system are described in detail next with reference to the drawings. In the following descriptions, constituent elements identical to those in the embodiments described above are denoted by like reference signs, and redundant descriptions thereof will be omitted.

In the second embodiment, a case where data values of the HB information through the SB4 information are acquired based on one instruction has been described as an example. However, among these data values, those of the HB information can be acquired based on an instruction different from that for data values of the SB1 information through the SB4 information. In this case, the acquisition sequence of the HB information can be omitted when the HB information acquired by the shift read at Step S153 in FIG. 9 is saved, for example, in the cache memory (see FIG. 2) of the NAND memory 100. This can further simplify the control during reads.

Similarly to the second embodiment, the configuration of the memory system according to the third embodiment can be identical to the memory system 1 exemplified in the first embodiment.

Figure 32:
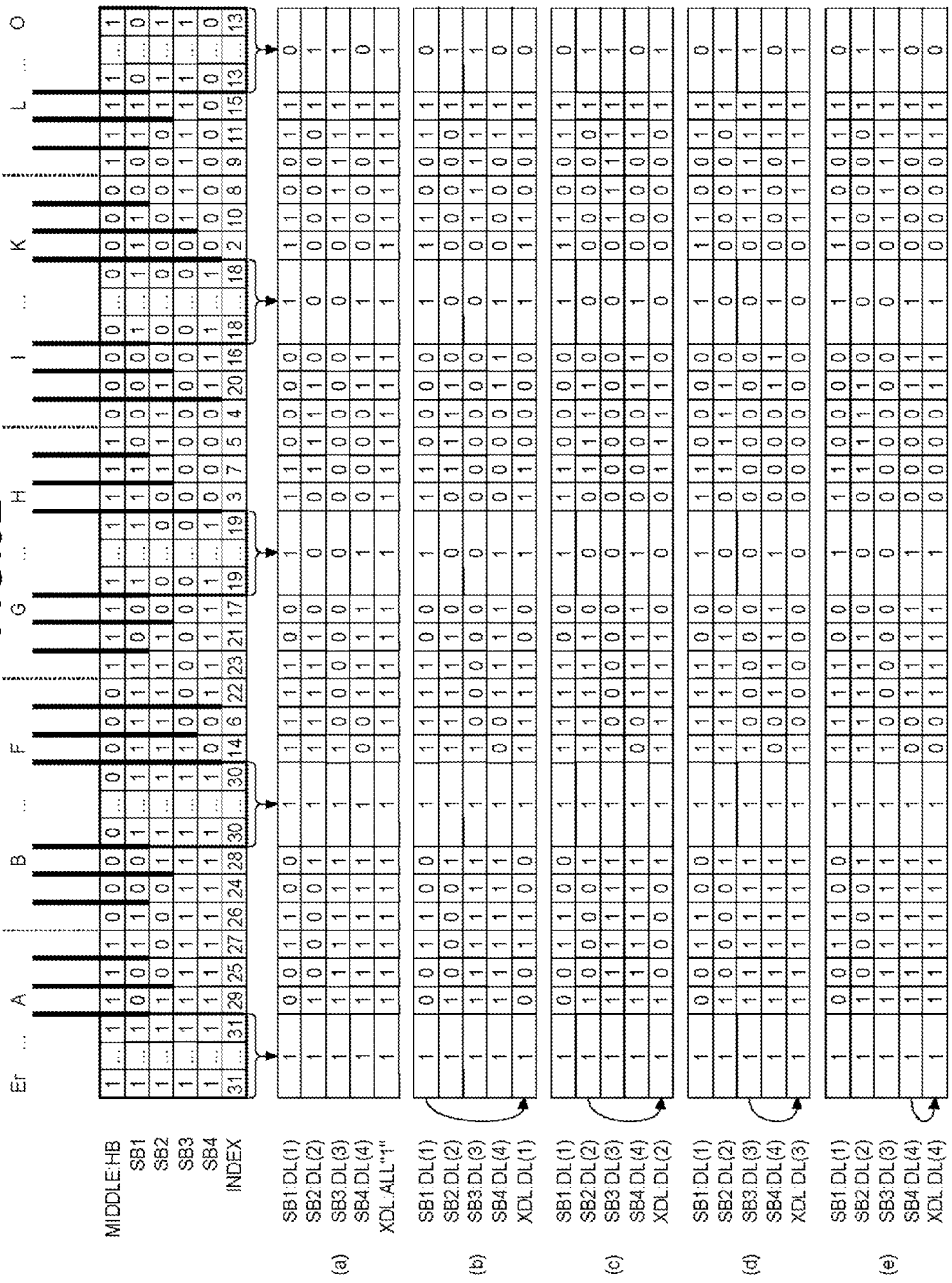
FIG. 32 illustrate a relation between SB1 information through SB4 information which are successively read and respective latch circuits in a third embodiment.

FIG. 32 are diagrams illustrating a relation between the SB1 information through the SB4 information successively read and the latch circuits DL(1) to DL(4). A relation in a case where the MIDDLE page is read is illustrated in FIG. 32.

As illustrated in FIG. 32(a), at a stage where the SB1 information through the SB4 information are successively read based on one instruction, the SB1 information read using the SB boundary voltages BR1, BR3, BR5, BR7, GR5, GR7, IR3, IR7, LR3, LR5, and LR7 is stored in the latch circuits DL(1), the SB2 information read using the SB boundary voltages BR2, BR6, GR6, IR2, IR6, and LR6 is stored in the latch circuits DL(2), the SB3 information read using the SB boundary voltages GR2 and LR2 is stored in the latch circuits DL(3), and the SB4 information read using the SB boundary voltages GR1, GR3, IR1, IR5, and LR1 is stored in the latch circuits DL(4). Because the HB information is not read in the concatenated soft bit read of successively reading the SB1 information through the SB4 information, initial values (all '1', for example) are kept stored in the latch circuits XDL as illustrated in FIG. 32(a).

The sequencer 170 then issues a command to transfer the SB1 information stored in the latch circuits DL(1) to the latch circuits XDL. Accordingly, the SB1 information is stored in the latch circuits XDL as illustrated in FIG. 32(b). When the SB1 information is retrieved by the CPU 230 from the latch circuits XDL, the SB2 information stored in the latch circuits DL(2) is transferred to the latch circuits XDL as illustrated in FIG. 32(c). When the CPU 230 retrieves the SB2 information from the latch circuits XDL, the SB3 information stored in the latch circuits DL(3) is transferred to the latch circuits XDL as illustrated in FIG. 32(d). When the CPU 230 retrieves the SB3 information from the latch circuits XDL, the SB4 information stored in the latch circuits DL(4) is transferred to the latch circuits XDL as illustrated in FIG. 32(e). Finally, the SB4 information is retrieved from the latch circuits XDL by the CPU 230.

Figure 33:
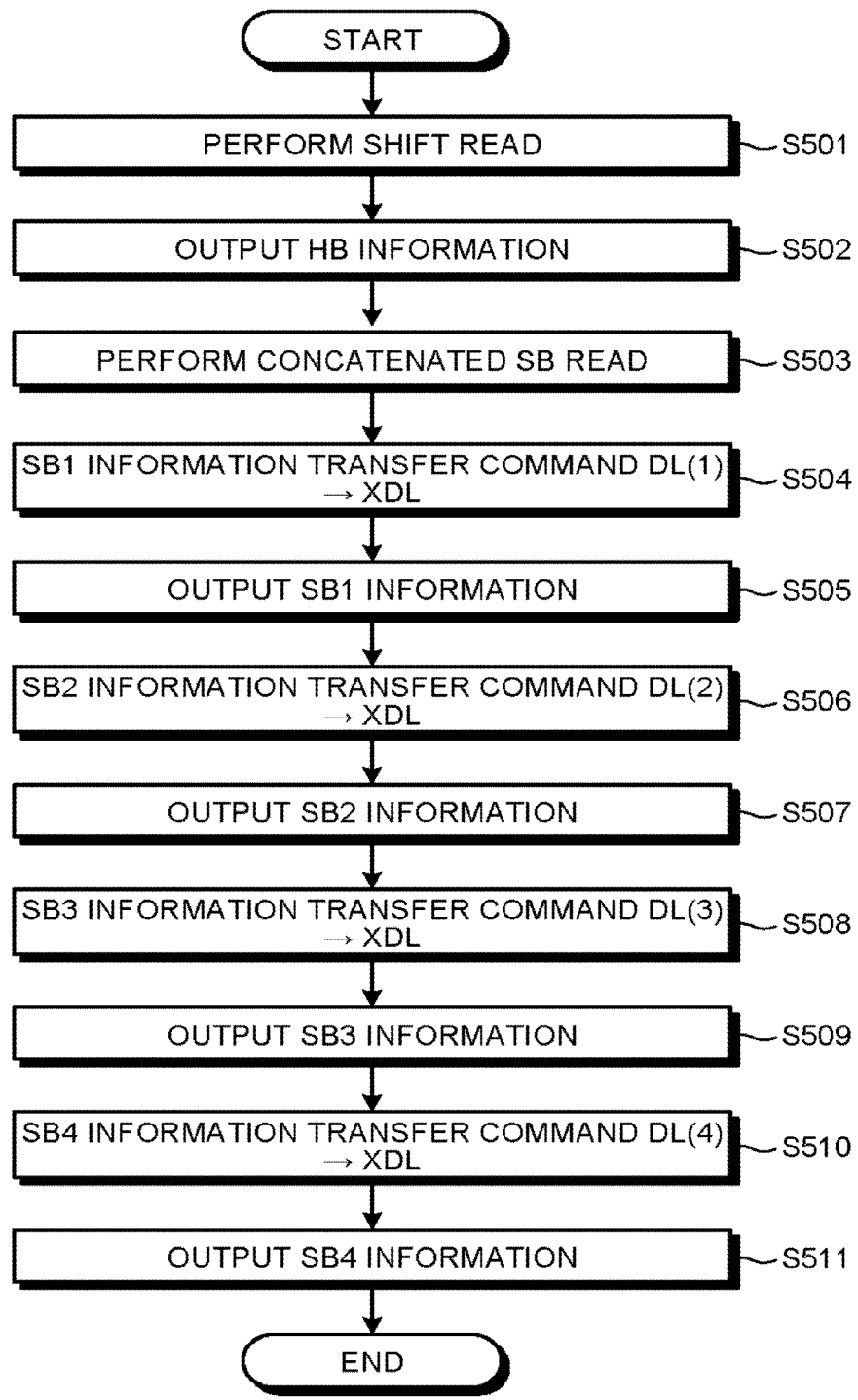
FIG. 33 is a flowchart illustrating an example of a main flow of a soft bit read according to the third embodiment.

A detailed operation example of the concatenated soft bit read according to the third embodiment is described in detail next with reference to the drawings. FIG. 33 is a flowchart illustrating an example of a main flow of the concatenated soft bit read according to the third embodiment. The operation illustrated in FIG. 33 is performed once for each of the LOWER page, the MIDDLE page, the UPPER page, and the HIGHER page illustrated in FIGS. 5 to 8 similarly to the operation described in the second embodiment with reference to FIG. 31.

As illustrated in FIG. 33, the sequencer 170 of the NAND memory 100 having received a concatenated SB read instruction from the CPU 230 first performs a hard bit read (shift read) using the optimum read level estimated at Step S125 in FIG. 9 (Step S501) and outputs the HB information thus stored in the latch circuits XDL to the CPU 230 (Step S502). When the HB information acquired by the shift read at Step S153 in FIG. 9 has been saved, for example, in the cache memory (see FIG. 2) of the NAND memory 100, Steps S501 and S502 in FIG. 33 can be omitted.

Next, the sequencer 170 performs the concatenated soft bit read using a read level with a waveform (a waveform obtained by eliminating the HB boundary voltages DR4, FR4, and JR4, or the HB boundary voltages BR4, GR4, IR4, and LR4 for reading the HB information from the voltage waveform illustrated in FIG. 27 or 29, for example) which is set for a read target page among the LOWER page, the MIDDLE page, the UPPER page, and the HIGHER page (Step 3503). In this way, the SB1 information is stored in the latch circuits DL(1), the SB2 information is stored in the latch circuits DL(2), the SB3 information is stored in the latch circuits DL(3), and the SB4 information is stored in the latch circuits DL(4). Initial values (all '1', for example) are stored in the latch circuits XDL.

Subsequently, the sequencer 170 performs identical operations to those at Steps S403 to S410 described in the second embodiment with reference to FIG. 31, thereby outputting the SB1 information through the SB4 information to the CPU 230.

Also the operation described above can simplify the control during reads and enables the reads in a shorter time.

Because other configurations, operations and effects are identical to those in the embodiments described above, detailed descriptions thereof will be omitted here.

Fourth Embodiment

A memory system according to a fourth embodiment and a method of controlling the memory system are described in detail next with reference to the drawings. In the following descriptions, constituent elements identical to those in the embodiments described above are denoted by like reference signs, and redundant descriptions thereof will be omitted.

Figure 34:
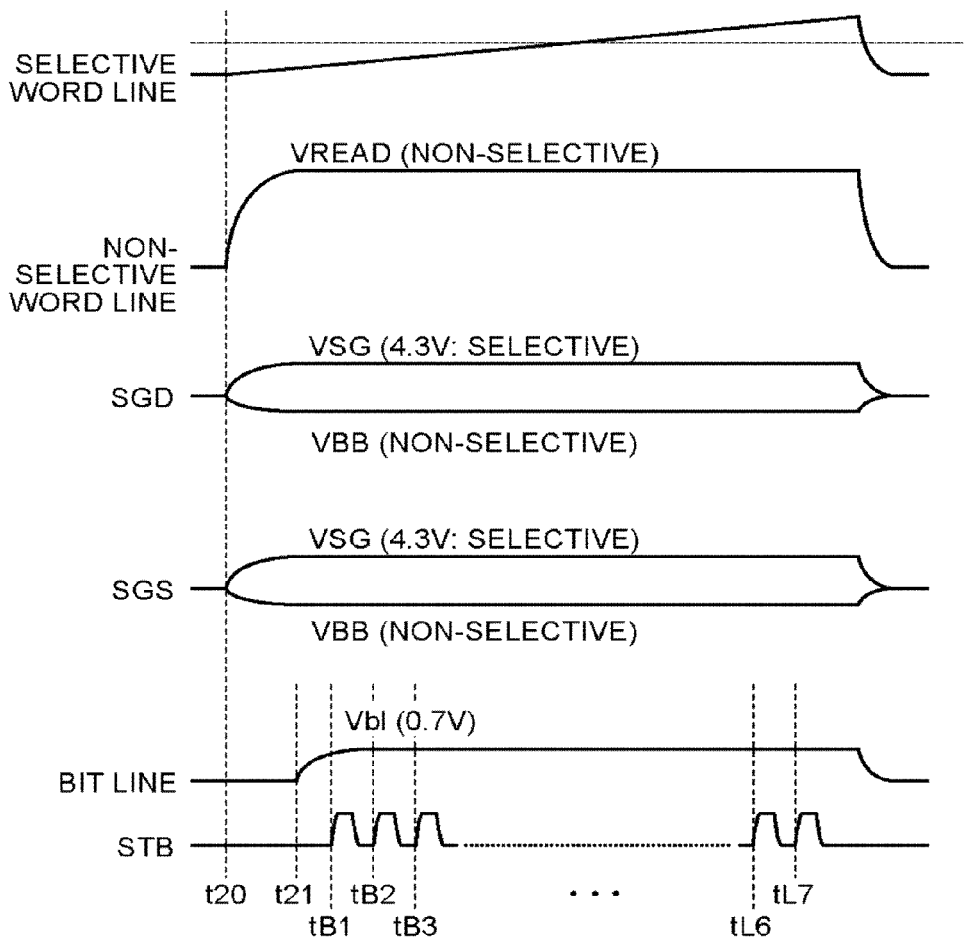
FIG. 34 is a waveform chart of voltage waveforms when a MIDDLE page according to a fourth embodiment is read.

In the second or third embodiment described above, waveforms that increase in a stepwise manner illustrated as examples in FIGS. 27 and 29 are used as a waveform of the read levels to be applied to a selective word line when data values of the HB information or the SB1 information through the SB4 information are acquired based on one instruction. However, the used waveform is not limited to those described above and can be a waveform that increases in a slope manner, for example. FIG. 34 is a voltage waveform chart in a case where the waveform of the read levels to be applied to a selective word line increases in a slope manner. A waveform chart of the voltage waveform when the MIDDLE page is read is illustrated in FIG. 34.

As illustrated in FIG. 34, when the sequencer 170 receives a concatenated SB read instruction from the CPU 230, the row decoder 120 gradually increases the read level of the selective word line at the timing of a time t20. At this time, the row decoder 120 applies the voltage VREAD to the non-selective word lines and also applies a voltage to the select gate lines SGD and SGS to turn the selective transistors ST1 and ST2 on. Next, the sense amplifier units SAU starts precharging bit lines to which read target memory cells are connected at the timing of a time t21. Thereafter, the sense amplifier units SAU set the signal STB to the "H" level at timings tB1 to tL7 when the voltage of the selective word line reaches BR1 to LR7 (see FIG. 28, for example) for successively reading the HB information through the SB4 information, respectively. This enables the HB information through the SB4 information to be read successively from the target memory cells and the respective pieces of the information to be stored in the corresponding latch circuits XDL and DL(1) to DL(4).

Figure 35:
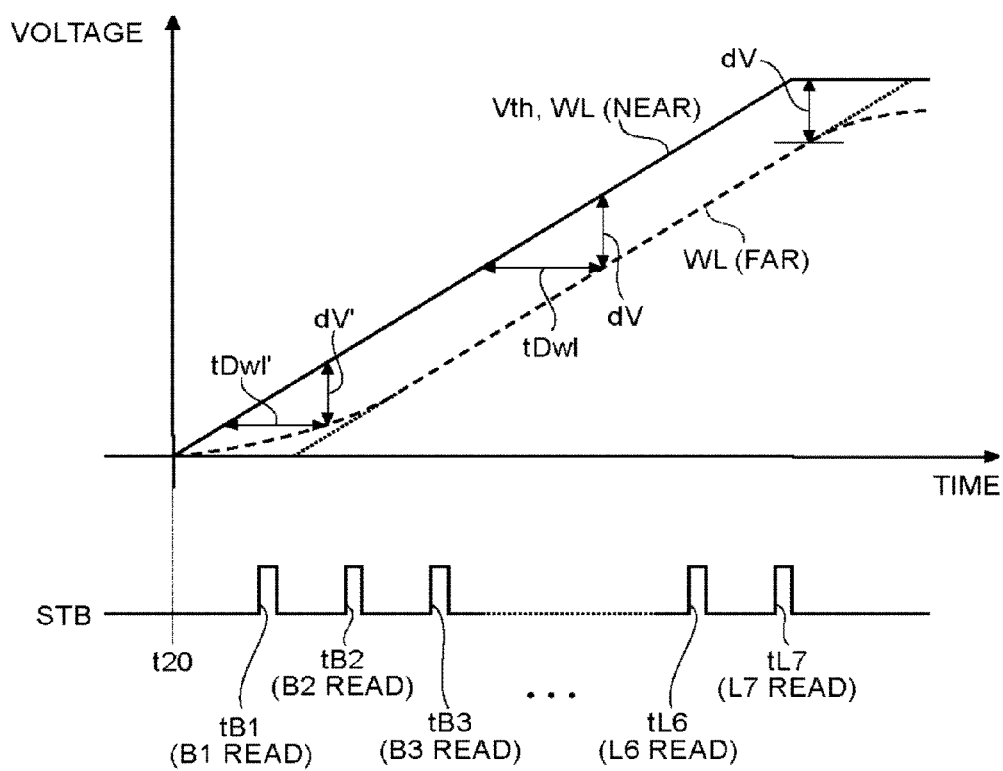
FIG. 35 illustrates an example of a read level applied to a memory cell relatively far from a row decoder according to the fourth embodiment, and a memory cell relatively near the row decoder.

However, the rise of the read level applied to the respective memory cells varies depending on distances along the selective word line from the row decoder 120 to the memory cells. FIG. 35 illustrates an example of a read level applied to a memory cell, the distance of which along the selective word line from the row decoder is relatively long, that is, a memory cell relatively far from the row decoder, and a read level applied to a memory cell, the distance of which is relatively short, that is, a memory cell relatively near the row decoder.

As illustrated in FIG. 35, a read level WL(NEAR) applied to a memory cell relatively near the row decoder 120 increases to substantially follow an increase of the read level Vth applied to the selective word line from the row decoder 120. In contrast thereto, a read level WL(FAR) applied to a memory cell relatively far from the row decoder 120 increases with a delay from the increase of the read level Vth applied to the selective word line from the row decoder 120. The reason is as follows. The influence of an RC circuit formed by a resistance value R of the selective word line from the row decoder 120 to a memory cell and a parasitic capacitance C thereof is negligibly small when the memory cell is relatively near the row decoder 120 while the influence becomes too large to ignore when the memory cell is relatively far from the row decoder 120.

In such a case, if a read from a memory cell relatively far from the row decoder 120 is performed at the same timing as a read from a memory cell relatively near from the row decoder 120, the read from the relatively-far memory cell is performed in a state where the read level is not completely increased, that is, a state where the read level is low.

However, the threshold voltage applied to the selective word line at the time of a write of data to a memory cell relatively far from the row decoder 120 also decreases depending on the distance along the selective word line from the row decoder 120. Accordingly, a threshold voltage distribution of memory cells is also shifted to a lower side depending on the distance along the selective word line from the row decoder 120. Therefore, a read from a memory cell relatively far from the row decoder 120 can be achieved in the state where the read level of a relatively-far memory cell is not completely increased, that is, the state where the read level is low. This suggests that a read from a memory cell relatively far from the row decoder 120 can be achieved at the same timing as that of a read from a memory cell relatively near the row decoder 120.

Furthermore, when the waveform of the read level applied to the selective word line at the time of a read is the waveform increasing in a slope manner as illustrated in FIGS. 34 and 35, the read level can be set to the optimum read level estimated at Step S125 in FIG. 9, for example, at the time of the shift read at Step S201 in FIG. 10 by changing a read timing, that is, a timing when the signal STB is transitioned to the "H" level without using the configuration in which an offset is provided to a voltage value of the read level applied to the selective word line based on the optimum read level estimated at Step S125 in FIG. 9, for example.

Because other configurations, operations and effects are identical to those in the embodiments described above, detailed descriptions thereof will be omitted here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory that includes memory cells each being capable of retaining a 4-bit value;
a controller that controls a write and a read of data to and from the non-volatile memory; and
a decoder that decodes data read from the non-volatile memory, wherein the controller acquires, when the total number of first read levels set for one of the memory cells with respect to first to fourth pages is P and the number of second read levels set for a higher side or a lower side of each of the first read levels is Q, information of S−1 pieces which is less than S pieces of information calculated using the following expression by 1 for acquiring information about the first to fourth pages from the one of the memory cells, $S=$(the number of bits required to represent $(P+1)$ areas)+(the number of bits required to represent $(Q+1)$ areas), one of the numbers of the first read levels set for the one of the memory cells with respect to the respective first to fourth pages is three, the numbers of the first read levels set for the one of the memory cells with respect to the respective residual pages are four, P is fifteen and Q is three, and the decoder decodes the S−1 pieces of information acquired by the controller.

2. The memory system according to claim 1, wherein the S−1 pieces of information are constructed from first information read out using the first read level and second to fifth information read out using the second read level.

3. The memory system according to claim 2, wherein
the non-volatile memory includes a sequencer that controls a read from the memory cells, and
the sequencer
acquires respective pieces of the first information on the first to fourth pages by performing a first read from the memory cells four times, and
acquires the second information to the fifth information on each of the first to fourth pages by performing a second read from the memory cells four times with respect to each of the first to fourth pages.

4. The memory system according to claim 3, wherein
the sequencer
acquires the first information on the first page by performing the first read of the first page using three different first read levels,
acquires the first information on the second page by performing the first read of the second page using four different first read levels,
acquires the first information on the third page by performing the first read of the third page using four different first read levels, and
acquires the first information on the fourth page by performing the first read of the fourth page using four different first read levels,
the fifteen first read levels in total are voltage values different from each other,
the controller acquires the second to fifth information on the first to fourth pages, respectively, by performing the second read using six second read levels that are set for each of the fifteen first read levels, and
the six second read levels set for each of the first read levels are read levels that are set with predetermined step sizes from a corresponding one of the first read levels.

5. The memory system according to claim 2, wherein
the non-volatile memory includes a sequencer that controls a read from the memory cells, and
the sequencer acquires the first to fifth information on each of the first to fourth pages by performing first to fourth reads to the memory cells.

6. The memory system according to claim 5, wherein
the first read levels include three different third read levels, four different fourth read levels, four different fifth read levels and four different sixth read levels, the third read levels, the fourth read levels, the fifth read levels and the sixth read levels being voltage values different from each other,
the sequencer
acquires the first to fifth information on the first page by performing the first read using the three different third read levels and six second read levels that are set for each of the third read levels,
acquires the first to fifth information on the second page by performing the second read using the four different fourth read levels and six second read levels that are set for each of the fourth read levels,
acquires the first to fifth information on the third page by performing the third read using the four different fifth read levels and six second read levels that are set for each of the fifth read levels, and
acquires the first to fifth information on the fourth page by performing the fourth read using the four different sixth read levels and six second read levels that are set for each of the sixth read levels,
the six second read levels that are set for each of the third read levels are read levels that are set with predetermined step sizes from a corresponding one of the third read levels,
the six second read levels that are set for each of the fourth read levels are read levels that are set with predetermined step sizes from a corresponding one of the fourth read levels,
the six second read levels that are set for each of the fifth read levels are read levels that are set with predetermined step sizes from a corresponding one of the fifth read levels, and
the six second read levels that are set for each of the sixth read levels are read levels that are set with predetermined step sizes from a corresponding one of the sixth read levels.

7. The memory system according to claim 6, wherein the sequencer
performs the first read using a first waveform that transitions from a lower read level to a higher read level among the three different third read levels and the six second read levels set for each of the third read levels,
performs the second read using a second waveform that transitions from a lower read level to a higher read level among the four different fourth read levels and the six second read levels set for each of the fourth read levels,
performs the third read using a third waveform that transitions from a lower read level to a higher read level among the four different fifth read levels and the six second read levels set for each of the fifth read levels, and
performs the fourth read using a fourth waveform that transitions from a lower read level to a higher read level among the four different sixth read levels and the six second read levels set for each of the sixth read levels.

8. The memory system according to claim 7, wherein the first to fourth waveforms are waveforms increasing in a stepwise manner.

9. The memory system according to claim 7, wherein the first to fourth waveforms are waveforms increasing in a slope manner.

10. The memory system according to claim 2, wherein
the first page is a LOWER page,
the second page is a MIDDLE page,
the third page is an UPPER page,
the fourth page is a HIGHER page,
the first information is hard bit information, and
the second information to the fifth information are soft bit information, respectively.

11. A method of controlling a memory system comprising a non-volatile memory that includes memory cells each being capable of retaining a 4-bit value, a controller that control a write and a read of data to and from the non-volatile memory, and a decoder that decodes data read from the non-volatile memory, wherein
the controller acquires, when the total number of first read levels set for one of the memory cells with respect to first to fourth pages is P and the number of second read levels set for a higher side or a lower side of each of the first read levels is Q, information of S−1 pieces which is less than S pieces of information calculated using the following expression by 1 for acquiring information about the first to fourth pages from the one of the memory cells, $S=$(the number of bits required to represent $(P+1)$ areas)+(the number of bits required to represent $(Q+1)$ areas), one of the numbers of the first read levels set for the one of the memory cells with respect to the respective first to fourth pages is three, the numbers of the first read levels set for the one of the memory cells with respect to the respective residual pages are four, P is fifteen, and Q is three, and
the decoder decodes the S−1 pieces of information acquired by the controller.

* * * * *